United States Patent
Chen et al.

(10) Patent No.: US 12,412,846 B2
(45) Date of Patent: Sep. 9, 2025

(54) SEMICONDUCTOR PACKAGE AND METHODS OF FABRICATING A SEMICONDUCTOR PACKAGE

(71) Applicant: Taiwan Semiconductor Manufacturing Company, Ltd., Hsinchu (TW)

(72) Inventors: Chin-Liang Chen, Kaohsiung (TW);
Hao-Cheng Hou, Hsinchu (TW);
Yu-Min Liang, Taoyuan (TW);
Jung-Wei Cheng, Hsinchu (TW);
Tsung-Ding Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 522 days.

(21) Appl. No.: 17/873,135

(22) Filed: Jul. 25, 2022

(65) Prior Publication Data
US 2024/0030157 A1 Jan. 25, 2024

(51) Int. Cl.
*H01L 23/00* (2006.01)
*H01L 21/48* (2006.01)
*H01L 23/538* (2006.01)

(52) U.S. Cl.
CPC ........ *H01L 23/562* (2013.01); *H01L 21/4857* (2013.01); *H01L 23/5383* (2013.01); *H01L 23/5385* (2013.01); *H01L 23/5386* (2013.01)

(58) Field of Classification Search
CPC ............... H01L 23/562; H01L 23/5383; H01L 23/5385; H01L 23/5386; H01L 23/145; H01L 23/3128; H01L 23/49816; H01L 21/4857; H01L 21/561; H01L 21/6835; H01L 2221/68331; H01L 2221/68359; H01L 2221/6834
See application file for complete search history.

(56) References Cited

U.S. PATENT DOCUMENTS

| | | | |
|---|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Alexander Sofocleous
*Assistant Examiner* — Christina A Sylvia
(74) *Attorney, Agent, or Firm* — JCIPRNET

(57) ABSTRACT

A semiconductor package provided herein includes a package substrate and a semiconductor device. The package substrate includes a redistribution structure, an interconnect structure bonded to the interconnect structure and an insulation material laterally surrounding the interconnect structure, wherein the redistribution structure has a reduced structure and the insulation material fills the reduced structure. The semiconductor device is bonded to the package substrate. In addition, a method of fabricating a semiconductor package is also provided and includes a precut process forming the reduced structure in the redistribution structure of the package substrate.

20 Claims, 16 Drawing Sheets

(56) References Cited

U.S. PATENT DOCUMENTS

2013/0069239 A1* 3/2013 Kim .................. H01L 23/5389
257/774
2013/0105989 A1* 5/2013 Pagaila .................. H01L 21/56
257/774

* cited by examiner

SEMICONDUCTOR PACKAGE AND METHODS OF FABRICATING A SEMICONDUCTOR PACKAGE

BACKGROUND

Semiconductor packages are used in a variety of electronic applications, such as personal computers, cell phones, digital cameras, and other electronic equipment. In terms of the packaging used for integrated circuit components or semiconductor dies, one or more packaged semiconductor devices such as chip packages are generally bonded to a circuit carrier (e.g., a system board, a printed circuit board, or the like) for electrical connections to other external devices or electronic components. Although the existing semiconductor package has been generally adequate for their intended purposes, it has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
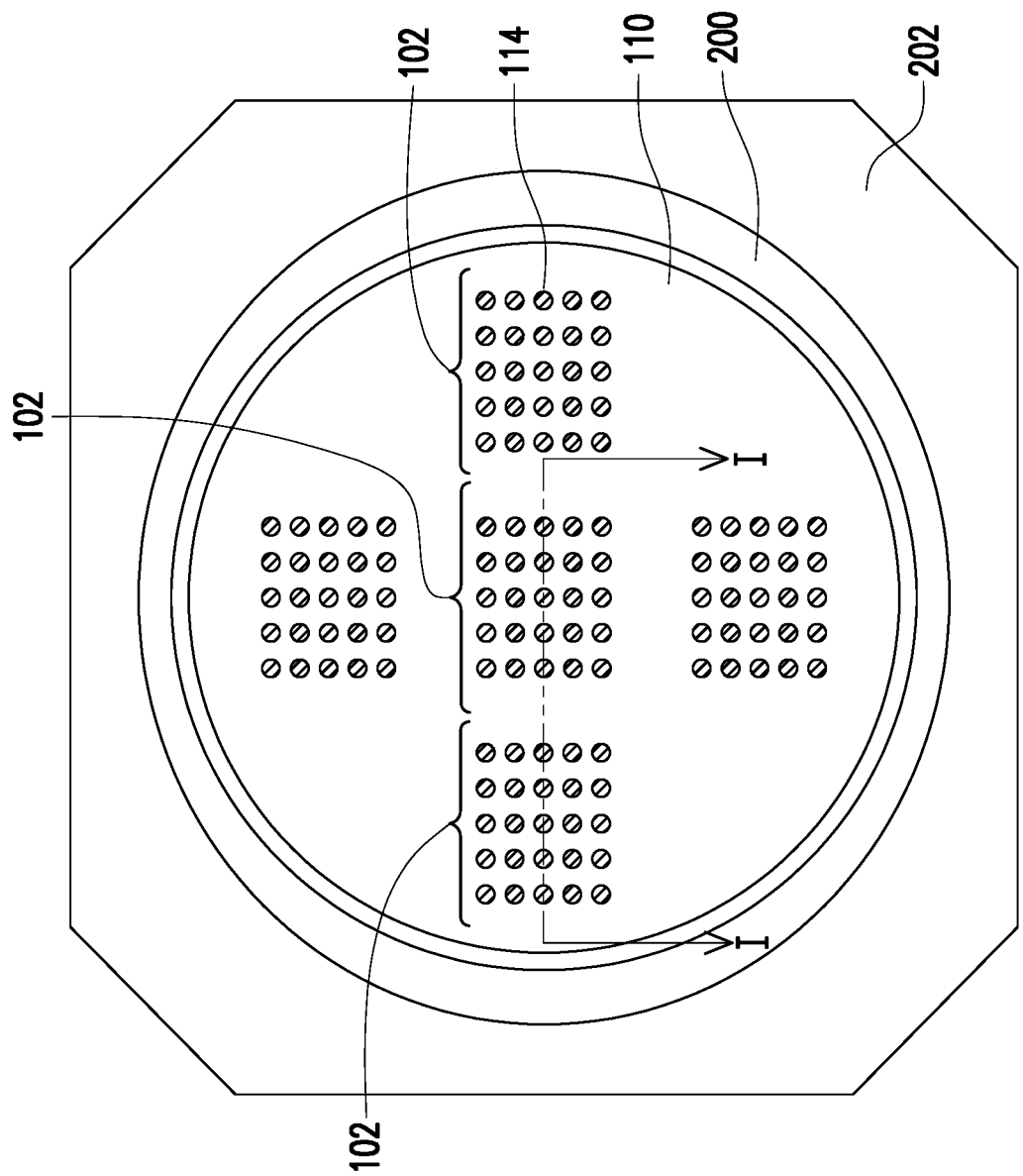
FIG. 1A and FIG. 1B schematically illustrate a plane view and a top view for a step of fabricating a semiconductor package in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component is having one or more integrated circuit dies. In some embodiments, the package component is a system-on-integrated-substrate (SoIS) package. The package component includes an interconnect structure bonded to a redistribution structure. In some embodiments, other components such as a locate interconnect component, an integrated voltage regulator, an integrated passive device, a static random-access-memory, the like, or a combination thereof can optionally be embedded in the redistribution structure. The embodiments disclosed herein may be applied to various systems such as high performance computing (HPC), edge computing, cloud computing, data centers, networking, and artificial intelligence. The redistribution structure is connected to one or more semiconductor device such as the integrated circuit dies and provides electrical connection between the integrated circuit dies and an interconnect structure such as a core substrate and/or between the integrated circuit dies. The core substrate is additionally connected to a set of external conductive features. In such a manner, the integrated circuit dies are electrically connected to the core substrate, and ultimately to the external conductive features, through the core substrate and the redistribution structure. Conductive connectors used to connect the core substrate to the redistribution structures may take the form of, for example, a ball grid array (BGA). Integration of such conductive connectors may provide flexibility in placement for semiconductor devices, such as integrated passive device (IPD) chips, integrated voltage regulators (IVRs), active chips, among other electrical components, to implement system-on-a-chip (SoC) type of package components, thus reducing fabrication complexity. Such embodiments may also provide a greater amount of flexibility for various other package configurations as well. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
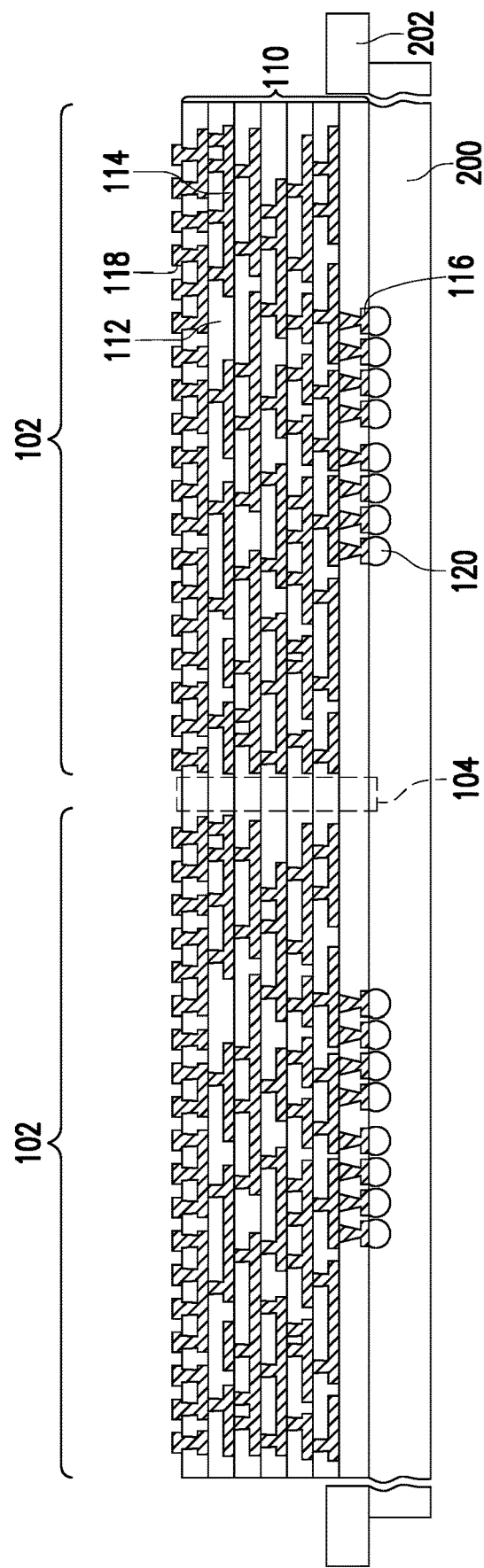

FIG. 1A and FIG. 1B schematically illustrate a plane view and a top view for a step of fabricating a semiconductor package in accordance with some embodiments of the disclosure. In FIG. 1A and FIG. 1B, a redistribution structure 110 is formed in advance and is transferred on a carrier 200. The carrier 200 may be a film carrier supported by a frame 202. In some embodiments, the redistribution structure 110 may have a circular wafer-like shape and be arranged in multiple package regions 102. FIG. 1B may specifically present an exemplary cross section of the redistribution structure 110 of FIG. 1A taken along line I-I while omit other portions. In some embodiments, an adhesive layer (not shown) may be formed on the carrier 200 to facilitate a subsequent debonding of the carrier 200. In addition, a plurality of conductive connectors 120 may be disposed on the redistribution structure 110 prior to transferring the redistribution structure 110 onto the carrier 200 and the conductive connectors 120 may be positioned between the redistribution structure 110 and the carrier 200. In some embodiments, the conductive connectors 120 may be formed on the redistribution structure 110 after the redistribution structure 110 is separated from the carrier 200.

In some embodiments, the redistribution structure 110 includes insulating layers 112 and redistribution layers 114 disposed between the insulating layers 112. The insulating layers 112 and the redistribution layers 114 may be alternately disposed in the thickness direction. In some embodiments, two redistribution layers 114 may be separated by one of the insulating layers 112. The insulating layers 112 may be formed of one or more suitable dielectric materials such as prepreg, resin coated copper (RCC), an oxide (e.g., silicon oxide), a nitride (e.g., silicon nitride), a photo image dielectric (PID), a polymer material such a PBO, a photosensitive polymer material, a molding material, a polyimide material, a low-k dielectric material, another dielectric material, the like, or a combination thereof. The insulating layer 208A may be formed by a process such as lamination, coating, (e.g., spin-coating), CVD, the like, or a combination thereof. The insulating layers 112 may have a thickness of between about 5 μm and about 50 μm, such as about 15 μm, although any suitable thickness may be used. In some embodiments, the insulation layers 112 may be patterned to form with openings exposing the underlying redistribution layer 114 using suitable photolithographic mask and etching process. In some embodiments in which one or more of the insulating layers 112 is formed of a photosensitive polymer such as PBO, polyimide, BCB, or the like, the openings may be patterned directly using an exposure and development process.

In some embodiments, the redistribution layers 114 are formed by a conductive material such as copper, titanium, tungsten, aluminum, another metal, the like, or a combination thereof. In some embodiments, the redistribution layers 114 may be formed by initially forming a seed layer (not shown) of one or more thin layers of a conductive material that aids in the formation of a thicker layer during subsequent processing steps. The seed layer may comprise a layer of titanium created using processes such as sputtering, evaporation, or PECVD processes, depending upon the desired materials. A photoresist (also not shown) may then be formed and patterned to cover the seed layer using, e.g., a spin coating technique. Once the photoresist has been formed and patterned, a conductive material may be formed on the seed layer through a deposition process such as electroplating or electroless plating, or the like. Once the conductive material has been formed, the photoresist may be removed through a suitable removal process such as ashing or chemical stripping. Additionally, the portions of the seed layer that were covered by the photoresist may be removed through, for example, a suitable wet etch process or dry etch process, which may use the conductive material as an etch mask. The remaining portions of the seed layer and conductive material form the redistribution layers 114. One of the redistribution layers 114 may extend in the opening of an underlying insulating layer 114 to be connected to another of the redistribution layers 114 to accomplish required electrical paths. The redistribution structure 110 may have one or more blank zones 104 and the redistribution layers 114 are not arranged in the blank zones 104. The blank zones 104 may be arranged at the boundary between the package regions 102, but the disclosure is not limited thereto.

In some embodiments, contact pads 116 may be formed at a side of the redistribution structure 110 and contact pads 118 may be formed at an opposite of the redistribution structures 110. The contact pads 116 are positioned between the conductive connectors 120 and the redistribution structure 110 under the orientation of the redistribution structure 110 shown in FIG. 1B and the contact pads 118 are revealed at a side away from the carrier 200 and thus the contact pads 118 are presented in the plane view of FIG. 1A. The contact pads 116 are connected to corresponding one of the redistribution layers 114 in the redistribution structure 110 through openings formed in corresponding one of the insulation layers 112. Similarly, the contact pads 118 are connected to corresponding one of the redistribution layers 114 in the redistribution structure 110 through openings formed in corresponding one of the insulation layers 112. The conductive connector 120 is disposed on the contact pads 116 to be electrically connected correspondingly to the redistribution structure 110. In some embodiments, the fabricating method of the contact pads 116 and the contact pads 118 may include the fabricating method of the redistribution layers 114 and the contact pads 116 and the contact pads 118 may be considered as the outermost ones of the redistribution layer 114. In some embodiments, the contact pads 116 and the contact pads 118 may be fabricated through a different method of fabricating the redistribution layers 114.

In some embodiments, an optional solderability treatment (e.g., pre-soldering treatment) may be performed on the exposed surfaces of the contact pads 116 prior to forming the conductive connectors 120. The conductive connectors 120 may be, for example, contact bumps or solder balls (e.g., C4 balls, ball grid array (BGA)), although any suitable type of connectors may be utilized. In some embodiments in which the conductive connectors 120 are contact bumps, the conductive connectors 120 may include a material such as tin, or other suitable materials, such as silver, lead-free tin, or copper. In some embodiments in which the conductive connectors 120 are tin solder bumps, the conductive connectors 120 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the conductive connectors 120.

In some embodiments, the redistribution structure 110 is fabricated in advance on a substrate (not shown) and the conductive connectors 120 are optionally formed on the redistribution structure 110 while the redistribution structure 110 remains on the substrate. Subsequently, a transferring process is adopted for transferring the redistribution structure 110 on the carrier 200 from the substrate to obtain the structure shown in FIG. 1A and FIG. 1B. In some embodiments, the conductive connectors 120 may be formed on the redistribution structure 110 after the redistribution structure 110 is separated from the carrier 200. As shown in FIG. 1A and FIG. 1B, the conductive connectors 120 as well as the redistribution structure 110 are arranged in multiple package regions 102 each of which is predetermined to be formed a semiconductor package. In FIG. 1A, five package regions 102 are shown as an example and the quantity of the package regions 102 may be determined based on the required designs.

Figure 2A:
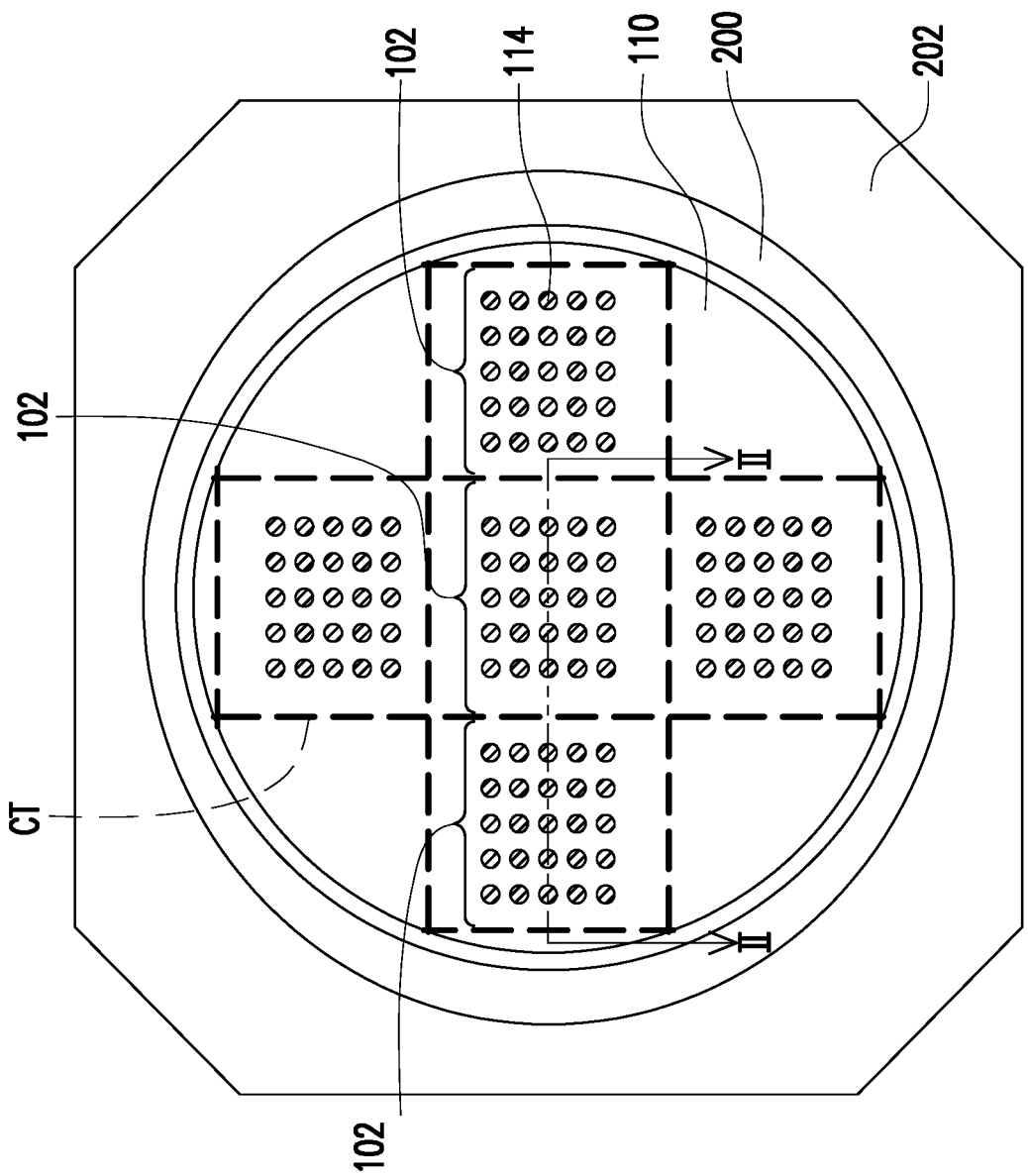
FIG. 2A and FIG. 2B schematically illustrate a plane view and a top view for a step of fabricating a semiconductor package in accordance with some embodiments of the disclosure.
Figure 2B:
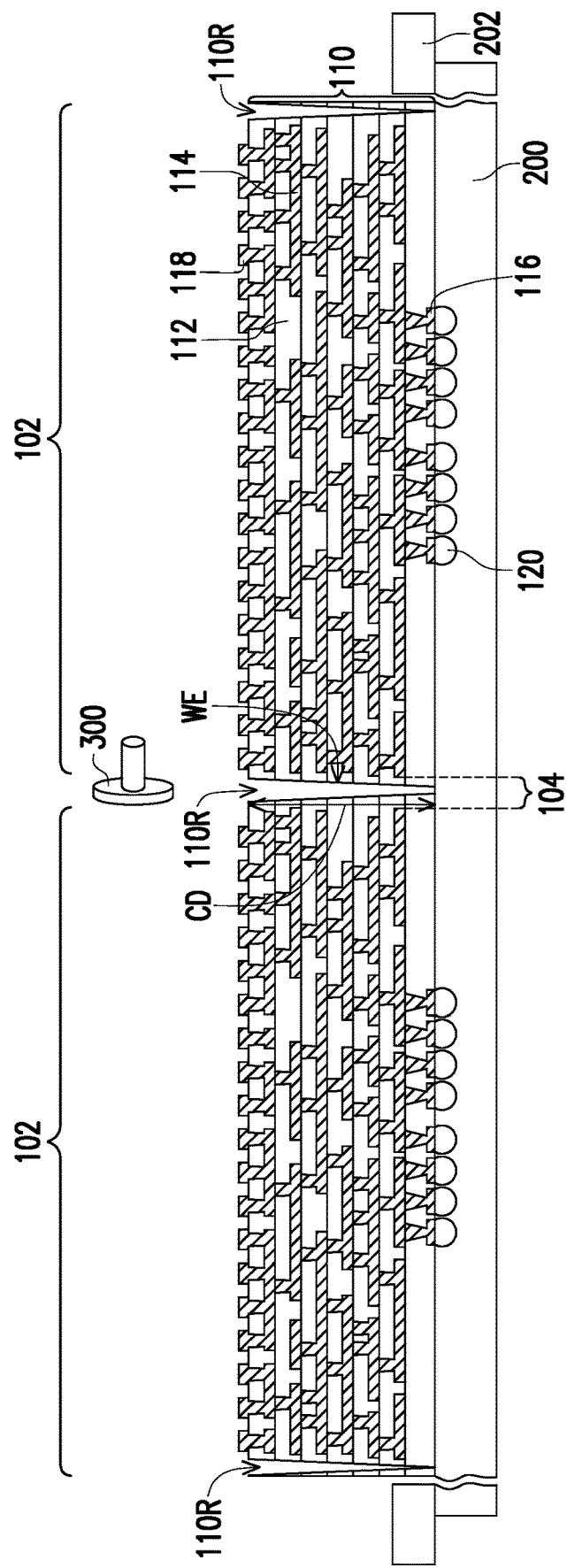

FIG. 2A and FIG. 2B schematically illustrate a plane view and a top view for a step of fabricating a semiconductor package in accordance with some embodiments of the disclosure. In FIG. 2A and FIG. 2B, a pre-cut process is performed. FIG. 2B may specifically present an exemplary cross section of the redistribution structure 110 of FIG. 2A taken along line II-II while omit other portions. In some embodiments, the pre-cut process is performed by carving the redistribution structure 110 along cutting traces CT1 using a dicing tool 300. In some embodiments, the dicing tool 300 may be a blade, a saw, a laser drill, an etching apparatus, and the like, or combinations thereof. The redistribution structure 110 may have one or more blank zones 104 and the cutting traces CT1 may be planned within the blank zones 104. In some embodiments, the blank zones 104 may be absent of the redistribution layers 114, the contact pads 116 and the contact pads 118.

In some embodiments, the pre-cut process is performed by carving the redistribution structure 110 until a cutting depth CD is reached to form reduced structures 110R in the redistribution structure 110. In some embodiments, each of the reduced structures 110R may extend through one or more of the insulating layers 114 of the redistribution structure 110. The pre-cut process is controlled so that the cutting depth CD do not reach the carrier 200 and thus the carrier 200 is not damage under the pre-cut process. In some embodiments, the cutting depth CD is smaller than the total thickness of the redistribution structure 110 so that one or more of the insulation layers 112 is not cut to maintain the continuity of the redistribution structure 110. In some embodiments, one or more wedged edge WE may be formed through the pre-cut process, and each of the reduced structures 110R is defined and demarcated by the corresponding wedged edge WE. The wedged edge WE may be extend obliquely with respect to the thickness direction of the redistribution structure 110. Accordingly, a portion of the insulating layers 112 of the redistribution structure 110 that is cut through the pre-cut process may have a gradually shrink edge in the thickness direction away from the carrier 200.

In some embodiments, the cutting traces CT1 may extend within the blank zones 104 positioned at the boundary between the package regions 102, but the disclosure is not limited thereto. In some embodiments, the cutting traces CT1 may be planned within the package regions 102 and may be planned along a linear trace, a circular tract, a zigzag trace, a dash trace, or other alternative traces. In some embodiments, the redistribution layers 114 in the redistribution structure 110 may be absent in the blank zones 104 and the reduced structure 110R is located in the blank zones 104, so that the redistribution layers 114 in the redistribution structure 110 are spaced from the reduced structure 110R, and particularly, spaced from the wedged surface WE defining the reduced structure 110R. In some embodiments, the blank zones 104 may not extend through the thickness of the redistribution structure 110 so that one or more of the redistribution layers 114 between the bottom level of the blank zone 104 and the level of contact pads 116 may extend laterally across the reduced structure 110R. For example, one or more of the insulating layers 112 may be disposed between one of the redistribution layers 114 and the bottom of the reduced structure 110R when the cutting depth CD is smaller than the thickness of the redistribution structure 110, so that an electric connection path may be established laterally across the reduced structure 110R. In some embodiments, the pre-cut process may be performed without cutting the conductive material of the redistribution layers 114 since the redistribution layers 114 are absent in the blank zones 104. Accordingly, the conductive material of the redistribution layers 114 is not exposed at the wedged edges WE and the electric connection paths established by the redistribution layers 114 are not damage by the pre-cut process.

Figure 3A:
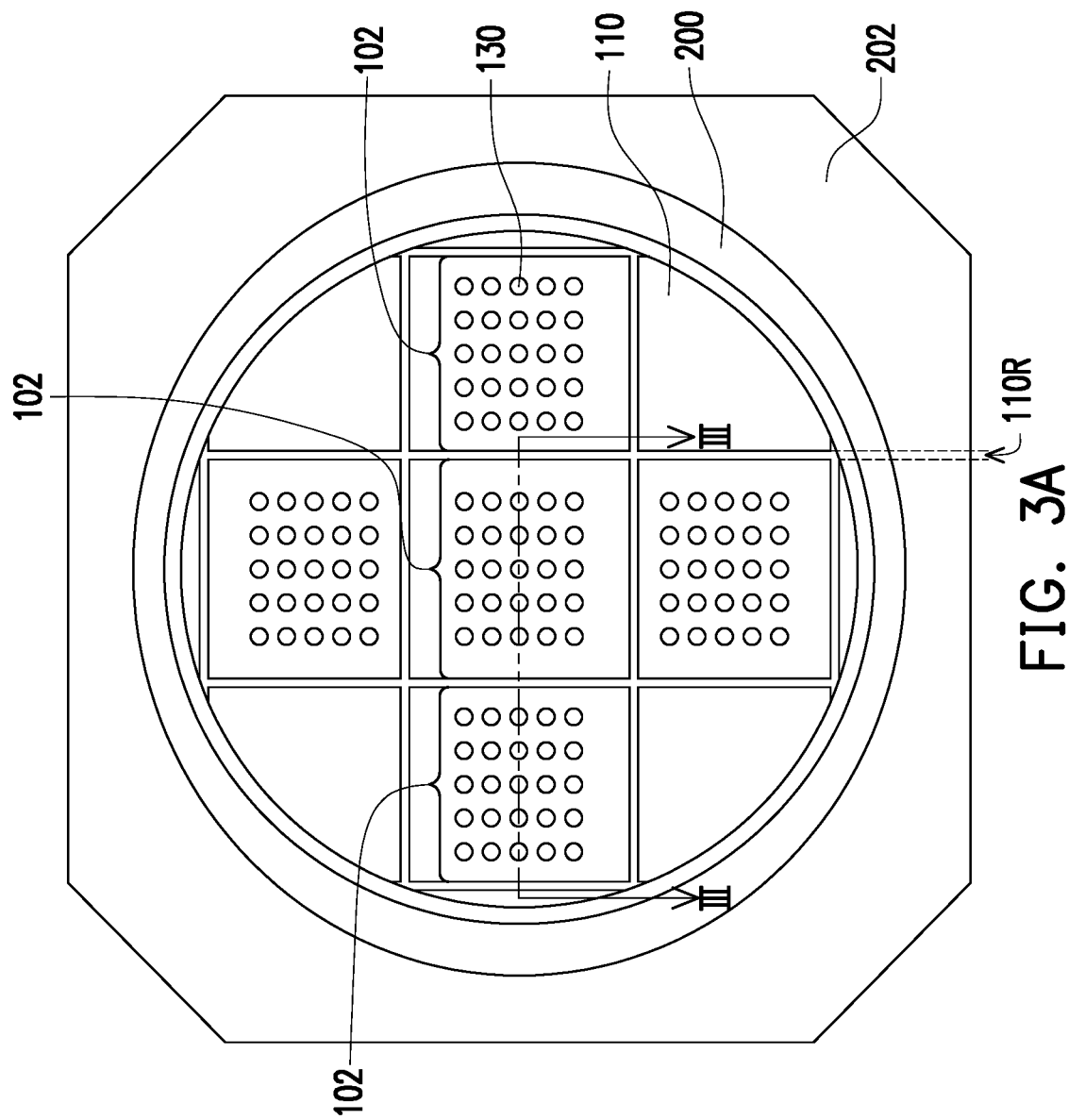
FIG. 3A and FIG. 3B schematically illustrate a plane view and a top view for a step of fabricating a semiconductor package in accordance with some embodiments of the disclosure.
Figure 3B:
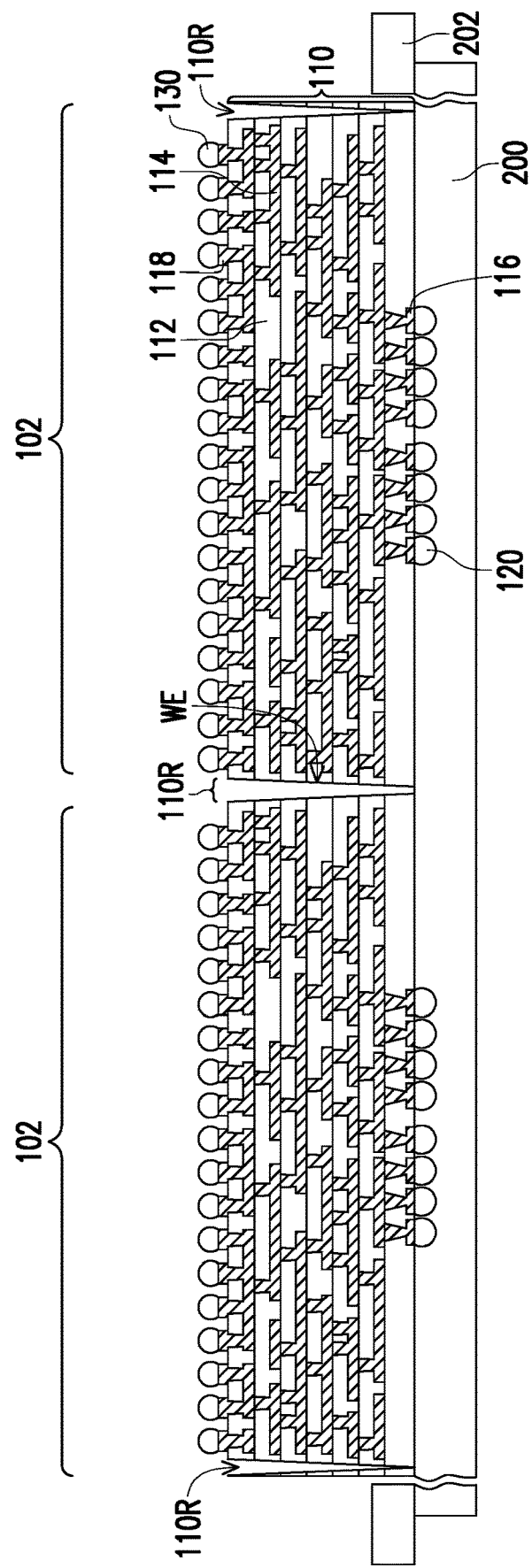

FIG. 3A and FIG. 3B schematically illustrate a plane view and a top view for a step of fabricating a semiconductor package in accordance with some embodiments of the disclosure. FIG. 3B may specifically present an exemplary cross section of the redistribution structure 110 of FIG. 3A taken along line III-III while omit other portions. In FIG. 3A and FIG. 3B, conductive connectors 130 are formed on the redistribution structure 110 that is pre-cut. The conductive connectors 130 are disposed on and connected to the contact pads 118 on the surface of the redistribution structure 110 opposite to the carrier 200. The conductive connectors 130 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 130 may include a conductive material such as solder, copper, aluminum, gold, nickel, silver, palladium, tin, the like, or a combination thereof. In some embodiments, the conductive connectors 130 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 130 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, a diameter of the conductive connectors 130 may be in a range of 25 um to 800 um, for example.

Figure 4A:
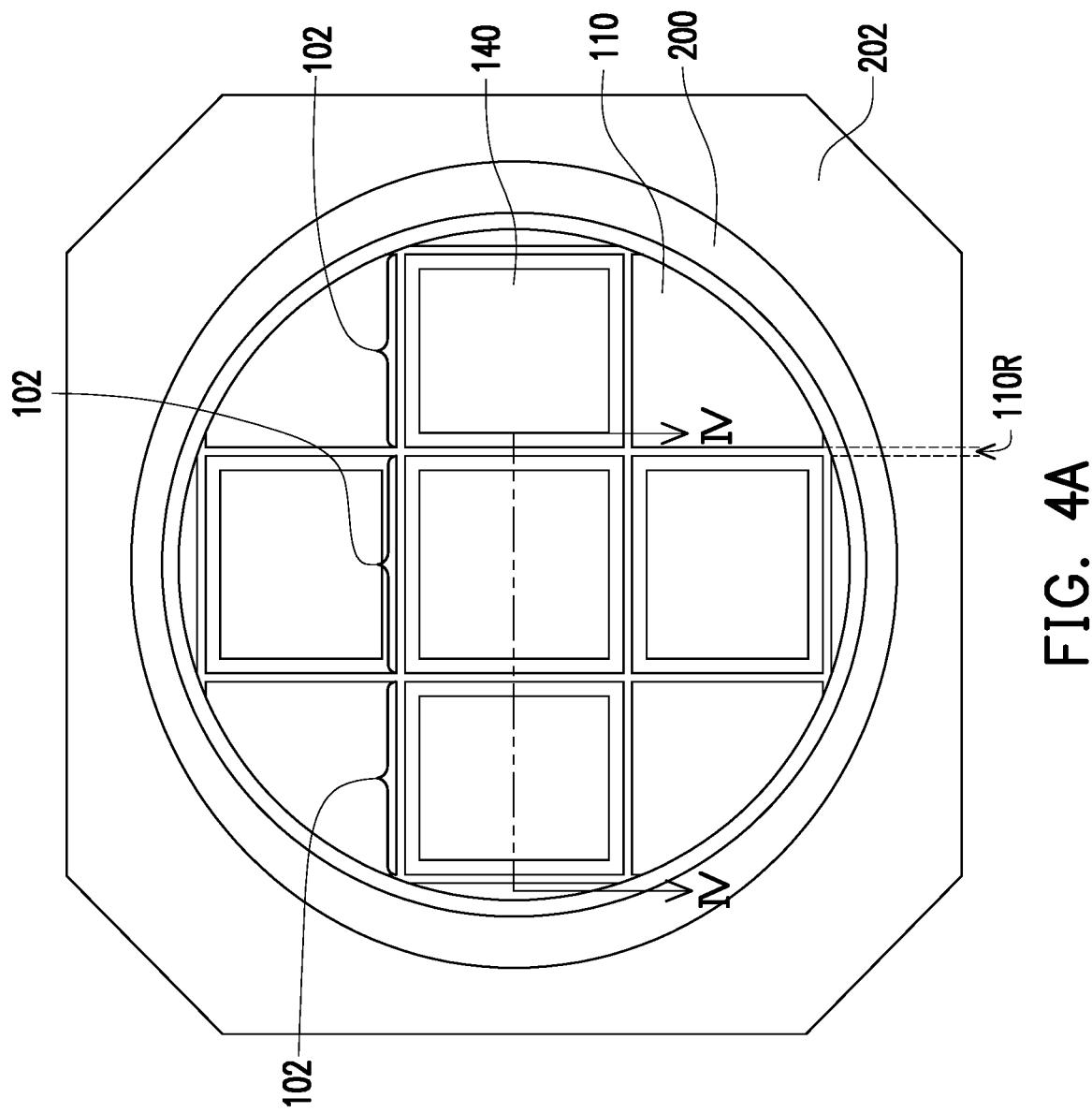
FIG. 4A and FIG. 4B schematically illustrate a plane view and a top view for a step of fabricating a semiconductor package in accordance with some embodiments of the disclosure.
Figure 4B:
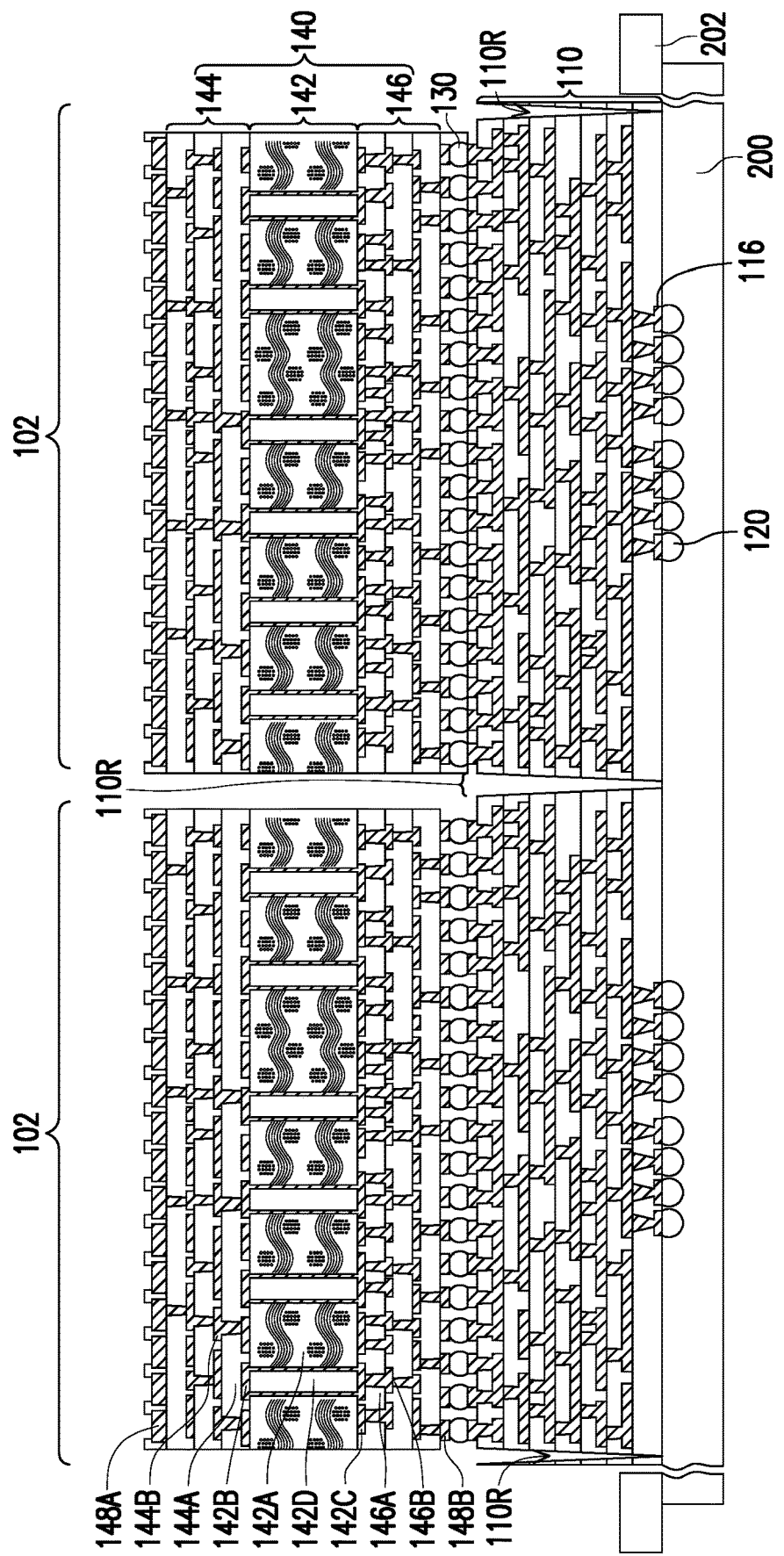

FIG. 4A and FIG. 4B schematically illustrate a plane view and a top view for a step of fabricating a semiconductor package in accordance with some embodiments of the disclosure. FIG. 4B may specifically present an exemplary cross section of a portion of the redistribution structure 110 of FIG. 4A taken along line IV-IV while omit other portions. In FIG. 4A and FIG. 4B, interconnect structures 140 are bonded to the redistribution structure 110 at a plurality of package regions 102. Each of the interconnect structures 140 is disposed on one of the package regions 102. In some embodiments, the interconnect structures 140 may be bonded to the redistribution structure 110 through the conductive connectors 130.

In some embodiments, each of the interconnect structures 140 may be, for example, an interposer or a "semi-finished substrate" which could either have active and passive devices or else may be free from active and passive devices. The interconnect structures 140 can also provide stability and rigidity to the attached redistribution structure 110. The interconnect structures 140 may be bonded to the redistribution structure 140 at respective package regions 102. During bonding the interconnect structures 140, a bonding stress directing toward the carrier 200 may be applied to the redistribution structure 110 and may be concentrated at the respective package regions 102, which is possible to cause undesirable warpage of the redistribution structure 110 and the carrier 200 since the carrier 200 is a film carrier with flexibility and the interconnect structures 140 are more rigid structures. In the embodiment, the redistribution structure 110 is pre-cut to have the reduced structures 110R which break the continuity of one or more insulating layers 112 in the redistribution structure 110 so that the reduced structures 110R may provide an effect of releasing the bonding stress of the respective interconnect structures 140. For example, during bonding the interconnect structures 140 to the redistribution structure 110, the bonding stress may be at least partially released and/or reduced through the reduced structure 110R. As such, the bonding stress may not concentrate at certain regions and the warpage due to the bonding stress may be mitigated. Accordingly, the connection between the interconnect structures 140 at the respective package regions 102 to the corresponding conductive connectors 130 may be ensured since the warpage effect is mitigated. In some embodiments, the reduced structures 110R may be deformed, for example narrowed, during bonding the interconnect structure 140 to buffer the bonding stress, but the disclosure is not limited thereto.

In some embodiments, the interconnect structure 140 may include a core layer 142 and two build-up layers 144 and 146 respectively located on two surfaces of the core layer 142. In some embodiments, the core layer 142 includes a core dielectric layer 142A, conductive lids 142B and 142C, and plated through holes 142D. In some embodiments, the core dielectric layer 142A includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer 142A may be formed by a lamination process, a coating process, or the like. The conductive lids 142B and 142C are formed on the opposite sides of the core dielectric layer 142A. In some embodiments, the conductive lids 142B and 142C include copper or other suitable conductive material, for example.

In some embodiments, the plated through holes 142D are disposed in and penetrate through the core dielectric layer 142A, which provide electrical connection between the conductive lids 142B and 142C. In some embodiments, the plated through holes 142D may be lined with a conductive material and filled up with an insulating material. In some embodiments, the method of forming the plated through holes TH includes the following operations. First, through holes (not shown) are formed at the predetermined positions by, for example, a mechanical or laser drilling, an etching, or another suitable removal technique. A desmear treatment may be performed to remove residues remaining in the through holes. Subsequently, the through holes may be plated with one or more conductive materials to a predetermined thickness, thereby providing the plated through holes 142D. For example, the through holes may be plated with copper with an electroplating or an electroless plating.

In some embodiments, the conductive lids 142B and 142C, and the plated through holes 142D may be formed by the following steps. First, first conductive material (not shown) is respectively formed on two opposite surfaces of the core dielectric layer 142A. Then, the plated through holes 142D are formed to penetrate the core dielectric layer 142A as mentioned before and provide electrical connection between the first conductive material respectively formed on both surfaces of the core dielectric layer 142A. Thereafter, second conductive material is respectively formed over the first conductive materials on the opposite surfaces of the core dielectric layer 142A, where the second conductive material may be different from the first conductive material. In some embodiments, the first and second conductive materials may be formed by using any suitable method (e.g., chemical vapor deposition (CVD) sputtering, printing, plating, or the like). Then, the first conductive materials and the second conductive materials may be patterned together to form core conductive layers (not shown) and the conductive lids 142B and 142C respectively. In some embodiments, the first and second conductive materials may be partially removed using a photolithography and etching process or another suitable removal technique.

Each of the build-up layers 144 and 146 may have any suitable number of dielectric layers 144A and routing layers 144B, including more or fewer than that shown in FIG. 4B. In some embodiments, one or both of the build-up layers 144 and 146 may be omitted. In some embodiments, the number of layers of the build-up layer 144 may be different from the number of layers of the build-up layer 146. In some embodiments, the build-up layers 144 is formed by forming the dielectric layer 144A over the conductive lids 142B and the core layer 142A. In some embodiments, the dielectric layer 144A may be a material such as a build-up material, ABF, a prepreg material, a laminate material, another material similar to those described above for the core layer 142, the like, or combinations thereof. The dielectric layer 144A may be formed by a lamination process, a coating process, or another suitable process. In some embodiments, openings are formed in the dielectric layer 144A that expose portions of the conductive lids 142B for subsequent electrical connection. In some embodiments, the openings are formed by, for example, an etching process, a laser drilling technique, or the like. Other processes, e.g., mechanical drilling or the like, may also be used in other embodiments. In some embodiments, an optional surface preparation process (e.g., a desmear process or the like) may be performed after the openings are formed.

A conductive material is then deposited to form routing layer 144B on the dielectric layer 144A and within the openings in the dielectric layer 144A. In some embodiments, the routing layer 144B is formed by first forming a seed layer and a patterned mask over the dielectric layer 144A. The patterned mask may be, for example, a patterned photoresist layer. Openings in the patterned mask may expose portions of the seed layer on which conductive material will subsequently be formed. The conductive material may then be deposited on the exposed regions of the dielectric layer 144A and within the openings in the dielectric layer 144A using, for example, a plating process, an electroless plating process, or another process. After depositing the conductive material, the patterned mask layer (e.g., the photoresist) may be removed using a wet chemical process or a dry process (e.g., an ashing process). In this manner, an additional routing layer (e.g., routing layer 144A) is formed over and electrically connected to the conductive lid 142B. Additional dielectric layers and routing layers may then be formed adjacent to the routing layer 144B and dielectric layer 144A to provide additional routing along with electrical connection within the build-up layer 144. The dielectric layers 144A and the routing layers 144B may be formed in alternating layers, and the build-up layer 144 may have any suitable number and configuration of dielectric layers and routing layers. In some embodiments, dielectric layers 146A and the routing layers 146B may be formed adjacent to the conductive lid 142C to form the build-up layer 146. The build-up layer 146 may be formed using a process similar to that of the build-up layer 144, described above. However, any suitable process may be utilized.

In some embodiments, protection layers 148A and 148B are formed over the build-up layers 144 and 146 of the interconnect structure 140. The protection layers 148A and 148B may be e.g., a solder resist material or a PBO material, and may be formed to protect the surfaces of the build-up layers 144 and 146. In some embodiments, each of the protection layers 148A and 148B may be a photosensitive material formed by printing, lamination, spin-coating, or the like. The photosensitive material may then be exposed to an optical pattern and developed, forming openings in the photosensitive material. In other embodiments, the protection layers 148A and 148B may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protection layers 148A and 148B may be formed and patterned over the build-up layers 144 and 146 using the same techniques. Other processes and materials may also be used.

Figure 5A:
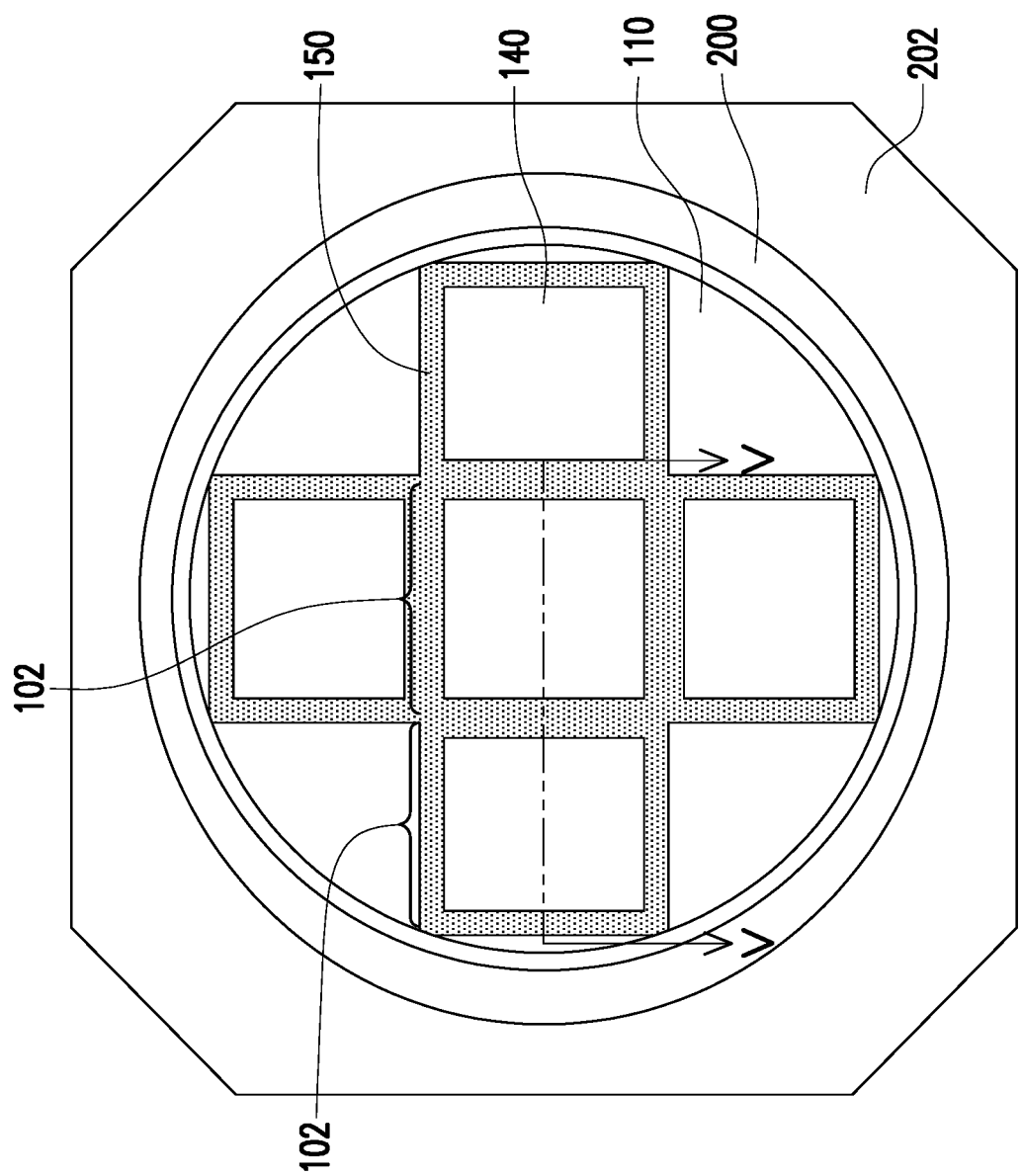
FIG. 5A and FIG. 5B schematically illustrate a plane view and a top view for a step of fabricating a semiconductor package in accordance with some embodiments of the disclosure.
Figure 5B:
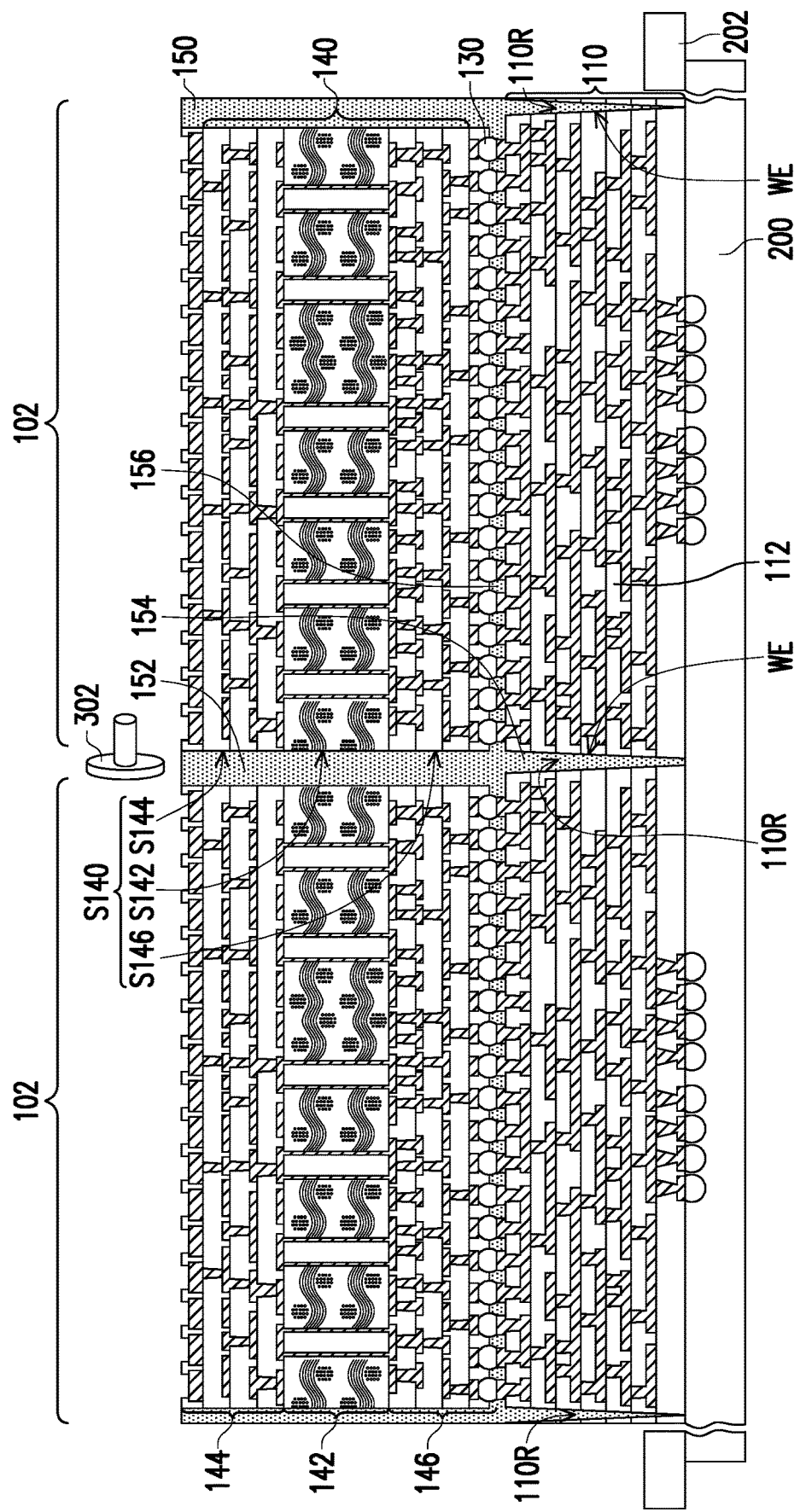

FIG. 5A and FIG. 5B schematically illustrate a plane view and a top view for a step of fabricating a semiconductor package in accordance with some embodiments of the disclosure. FIG. 5B may specifically present an exemplary cross section of a portion of the redistribution structure 110 of FIG. 5A taken along line V-V while omit other portions of the redistribution structure 110. In FIG. 5A and FIG. 5B, an insulating material 150 is formed over the carrier 202 to encapsulate the package substrate 150. In some embodiments, the insulating material 150 may be molding compound, molded underfill, polymer such as polyimide, polybenzoxazole (PBO) or benzocyclobutene (BCB), Ajinomoto Buildup Film (ABF) or other suitable encapsulating materials, for example. In some embodiments, the insulating material 150 may be formed by a molding process or other suitable methods. In the exemplary embodiment, the insulating material 150 is formed by an over-molding process. In some embodiments, the insulating material 150 may cover a sidewall of the interconnect structure 140. In addition, the insulating material 150 is formed between the outermost conductive patterns of the build-up layer 146, formed aside the conductive connectors 130 and the outermost conductive patterns of the redistribution structure 110. Accordingly, the interconnect structure 140 is embedded in the insulating material 150.

In FIG. 5A and FIG. 5B. the insulation material 150 may extend to fill the reduced structure 110R of the redistribution structures 110 and thus the wedged surface WE of the redistribution structure 110 is covered by and in contact with the insulation material 150. In some embodiments, the insulation material 150 may completely fill the reduced structure 110R and thus there might be no void formed inside reduced structure 110R. Accordingly, the redistribution structure 110 is filled to have desirable mechanical property. The insulation material 150 may include a first portion 152 laterally surrounding the interconnect structure 140, a second portion 154 filling the reduced structure 110R of the redistribution structure 110 and a third portion 156 filling the space between the conductive connectors 130. The first portion 152, the second portion 154 and the third portion 156 of the insulation material 150 may be formed in a one-piece form with the same material. In some embodiments, the third portion 156 may be formed using a first insulation material firstly and the first portion 152 and the second portion 154 may be subsequently formed using a second insulation material. Therefore, the insulation material 150 may be formed by dual-step encapsulation process. In the dual-step encapsulation process, the first insulation material may be the same as or different from the second material based on different requirements.

As shown in FIG. 5B, the sidewall S142 of the core layer 142, the sidewall S144 of the build-up layer 144 and the sidewall S146 of the build-up layer 146 may form the sidewall S140 of the interconnect structure 140. The first portion 152 of the insulation material 150 is in contact with the sidewalls S142, S144 and S146 to at least laterally encapsulate the interconnect structure 140. The second portion 154 of the insulation material 150 may be in contact with the insulating layers 112 of the redistribution structure 110 extending to the wedged surface WE. The second portion 154 of the insulation material 150 may have a taper shape along with the wedged edge WE. The third portion 156 may be disposed in the gap between the interconnect structure 140 and the redistribution structure 110 and surround the conductive connectors 130.

Figure 6:
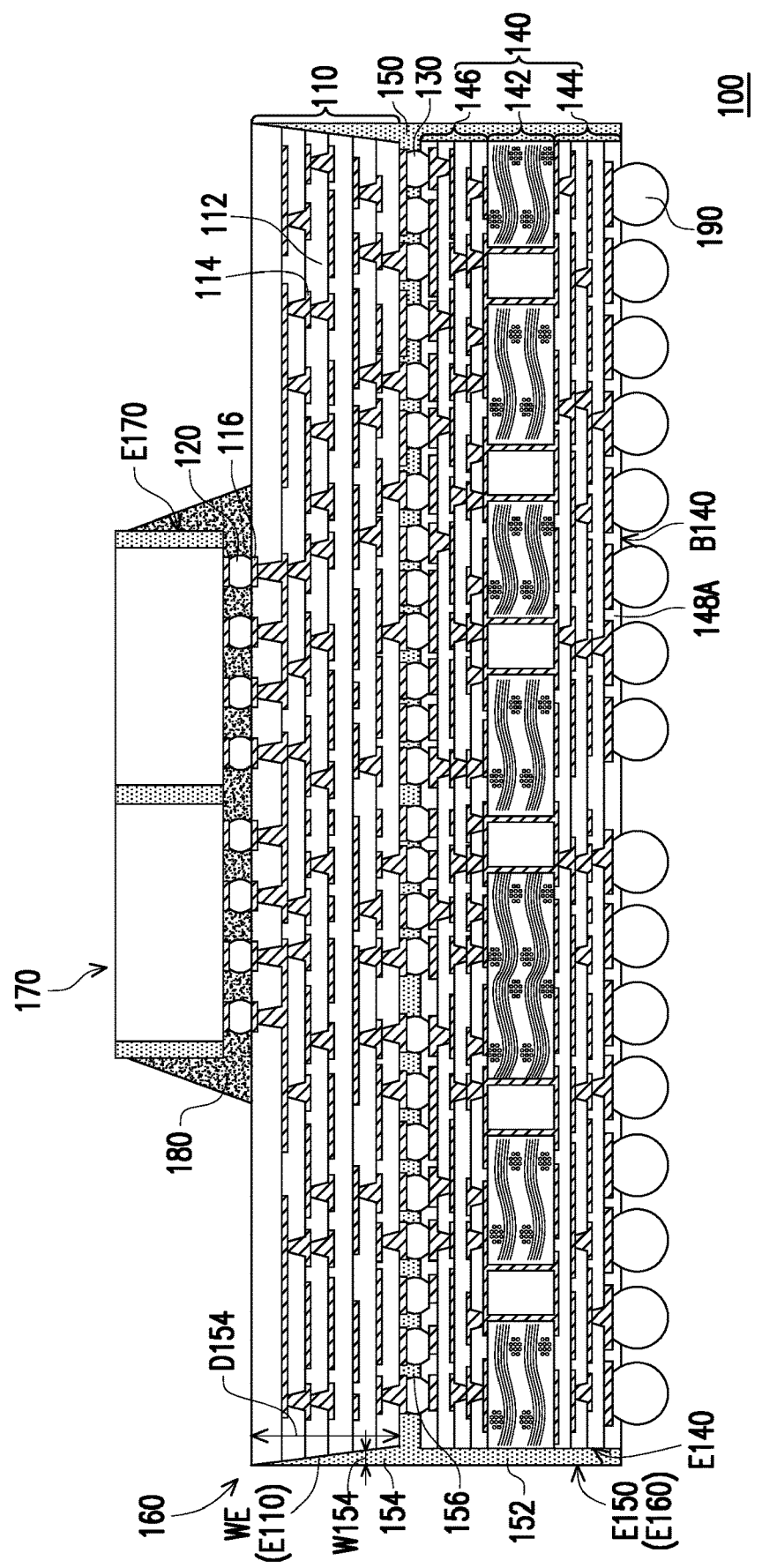
FIG. 6 schematically illustrates a cross sectional view of a semiconductor package in accordance with some embodiments of the disclosure.

After the insulation material 150 is formed to encapsulate the interconnect structure 140, a singulation process is performed to separate the package regions 102. In some embodiments, the singulation process may include separating the structures at the respective package regions 102 using a dicing tool 302 which may be similar to the dicing tool 300 described in FIG. 3B. In some embodiments, the separated structures obtained from dicing the structure of FIG. 5B are, for example, package substrates and the separated package substrate may be utilized to fabricate a semiconductor package 100 as shown in FIG. 6. In some embodiments, after the structure of FIG. 5B is singulated to individual package substrates, the singulated package substrates are oriented upside down with respect to the orientation shown in FIG. 5B and the conductive connectors 120 may be fabricated on the individual package substrates after the package substrates are singulated. In some embodiments, the conductive connectors 120 may be omitted from the fabrication of the package substrates.

Specifically, FIG. 6 shows the semiconductor package 100 that is fabricated from one package substrate 160 singulated from the structure in one package region 102 of FIG. 5B. In some embodiments, after the singulation process, a semiconductor device 170 is bonded onto the package substrate 160, an underfill 180 is formed to fill the gap between the package substrate 160 and the semiconductor device 170, and external connectors 190 are formed on the package substrate 160 opposite to the semiconductor device 170, so that the semiconductor package 100 is obtained. Accordingly, the semiconductor package 100 includes at least the package substrate 160 and the semiconductor device 170 bonded to the package substrate 160. The semiconductor device 170 may be a packaged device and may be bonded to the package substrate 160 through the conductive connector 120. In some embodiments, the semiconductor package 100 may be mounted to an external substrate (not shown) through the external connectors 190 to obtain a system package. The external substrate may be a printed circuit board such as a laminate substrate formed as a stack of multiple thin layers (or laminates) of a polymer material such as bismaleimide triazine (BT), FR-4, ABF, or the like.

The package substrate 160 is fabricated by the steps described in FIGS. 1A to 5A and 1B to 5B. The package substrate 160 may include a redistribution structure 110, an interconnect structure 140 and an insulation material 150. In some embodiments, the conductive connectors 120 and the conductive connectors 130 are disposed at two opposite sides of the redistribution structure 110. The interconnect structure 140 may be connected to the redistribution structure 110 through the conductive connectors 130 between the redistribution structure 110 and the interconnect structure 140, and the semiconductor device 170 is bonded to the redistribution structure 110 through the conductive connectors 120. Therefore, the redistribution structure 110 may be positioned between the semiconductor device 170 and the interconnect structure 140 in the thickness direction. In some embodiments, the insulation material 150 laterally surrounds the redistribution structure 110 and the interconnect structure 140 so that the sidewall E160 of the package substrate 160 may be defined by the sidewall E150 of insulation material 150. In some embodiments, the sidewall E110 of the redistribution structure 110 may be partially exposed without being completely covered by the insulation material 150 so that the sidewall E160 of the package substrate 160 may include the sidewall E150 and an exposed portion of the sidewall E110.

In some embodiments, the conductive conductors 120 are arranged with a pitch of about 130 μm, the conductive connectors 130 are arranged with a pitch of about 500 μm, and the external connectors 190 are arranged with a pitch of about 1000 μm. In some embodiments, the conductive conductors 120 have a dimension of about 70 μm, the conductive connectors 130 have a dimension of about 250 μm, and the external connectors 190 have a dimension of about 500 μm. Accordingly, the package substrate 160 enlarges the scale of the bonding sites to facilitate the bonding to an external substrate such as a circuit board or the like. However, the values described herein are examples and should not construed as limitation of the disclosure.

The redistribution structure 110 includes insulating layers 112 and redistribution layers 114 alternately disposed in the thickness direction. The redistribution layers 114 includes a plurality of conductive patterns laterally surrounded by the insulating layers 112 and the redistribution layers 114 are absent at and spaced from the sidewall E110 of the redistribution structure 110. Side edges E114 of the insulating layers 112 form the sidewall E110 and the side edges E114 may be immediately connected to one another without being interposed. In some embodiments, no material of the redistribution layers 114 is exposed at the sidewall E110. In some embodiments, the sidewall E110 of the redistribution structure 110 may include the wedged surface WE formed by the pre-cut process described in FIG. 2A and FIG. 2B. In some embodiments, the pre-cut process reaches a depth that extends through the thickness of the redistribution structure 110 so that an entire of the sidewall E110 forms the wedged surface WE. In some embodiments, the pre-cut process reaches a depth that is smaller than the thickness of the redistribution structure 110 so that a portion of the sidewall E110 forms the wedged surface WE while the other portion of the sidewall E110 may be coplanar with the sidewall E150 of the insulation material 150. The redistribution structure 110 may have a lateral dimension gradually changed in the thickness direction to form the wedged surface WE. For example, the lateral dimension of the redistribution structure 110 may be gradually reduced in a direction from the conductive connectors 120 to the conductive connectors 130, or gradually reduced in a direction directing toward the interconnect structure 140. Therefore, the wedged surface WE may be gradually shrunk in the direction from the conductive connectors 120 to the conductive connectors 130, or in the direction directing toward the interconnect structure 140. In some embodiments, the insulation material 150 may compensate the oblique configuration of the wedged surface WE to obtain a substantially upright sidewall E150.

The interconnect structure 140 is connected to the redistribution structure 110 through the conductive connectors 130. The interconnect structure 140 may have a lateral dimension smaller than a maximum dimension of the redistribution structure 110. In some embodiments, the sidewall E140 of the interconnect structure 140 may be laterally shrunk with respect to at least a portion of the sidewall E110 of the redistribution structure 110. The interconnect structure 140 includes a core layer 142 and two build-up layers 144 and 146. The core layer 142 and the two build-up layers 144 and 146 may have the same lateral dimension so that the interconnect structure 140 may have an upright structure. Sidewalls of the core layer 142 and the two build-up layers 144 and 146 constructing the sidewall E140 of the interconnect structure 140 may be covered by and in contact with the insulation material 150. The external connectors 190 are disposed on the interconnect structure 140 at an external bonding surface B140 away from the redistribution structure 110. The external bonding surface B140 is not covered by the insulation material 150.

The insulation material 150 may include a first portion 152 laterally surrounding the interconnect structure 140, a second portion 154 laterally surrounding the wedged surface WE of the redistribution structure 110 and a third portion 156 filling the gap between the redistribution structure 110 and the interconnect structure 140 and spaces between the conductive connectors 130. Accordingly, the insulation material 150 laterally surrounds and encapsulates the interconnect structure 140, the conductive connectors 130 and the redistribution structure 110. The first portion 152, the second portion 154 and the third portion 156 may be formed in a one-piece form, but the disclosures is not limited thereto. In some embodiments, one or more of the first portion 152, the second portion 154 and the third portion 156 may be an individually formed portion. The insulation material 150 may include a material such as a molding compound, an epoxy, an underfill, a dispense molding underfill (DMUF), a resin, or the like. The insulation material 150 may be dispensed using, e.g., a molding process, such as a transfer molding process, an injection process, combinations of these, or the like. The insulation material 150 can protect the conductive connectors 130 and can provide structural support for the interconnect structure 140 as well as the redistribution structure 110.

The sidewall E150 of the insulation material 150 is formed by the singulation process including dicing the structure shown in FIG. 5B along the boundary between adjacent package regions 102. In some embodiments, the lateral dimensions of the redistribution structure 110 and the interconnect structure 140 are different to form a stair-like structure and the insulation material 150 is formed laterally surround the redistribution structure 110 and the interconnect structure 140 to compensate the stair-like structure to obtain a substantially upright structure of the package substrate 160. In some embodiments, the sidewall E160 of the package substrate 160 may extend linearly along the thickness direction.

The first portion 152 of the insulation material 150 is in contact with and covers the sidewall E140 of the interconnect structure 140. The first portion 152 may laterally surround the interconnect structure 140 to form an encircled ring pattern in a bottom view (not shown). The first portion 152 may expose the external bonding surface B140 of the interconnect structure 140 so that the external connectors 190 disposed on the external bonding surface B140 of the interconnect structure 140 are exposed without being encapsulated. In some embodiments, the first portion 152 of the insulation material 150 may be leveled with the external bonding surface B140 of the interconnect structure 140. For example, the end surface of the first portion 152 may be coplanar with the exposed surface of the protection layer 148A in the interconnect structure 140.

In some embodiments, the second portion 154 of the insulation material 150 may extend along the wedged surface WE of the redistribution structure 110. The second portion 154 may have a width W154 measured in the lateral direction. The width W154 of the second portion 154 may be altered along with the wedged surface WE of the redistribution structure 110. In some embodiments, the width 154 of the second portion 154 may be gradually reduced in a direction away from the interconnect structure 140. The second portion 154 may have a taper structure in the cross section as shown in FIG. 6 to compensate the wedged surface WE. In addition, the second portion 154 may fill the reduced structure R110 and thus an extending depth D154 of the second portion 154 may be corresponding to the cutting depth CD of the pre-cut process described in FIG. 2A and FIG. 2B.

The third portion 156 of the insulation material 150 fills the gap between the redistribution structure 110 and the interconnect structure 140 and surrounds the conductive connectors 130 to encapsulate the conductive connectors 130. The third portion 156 of the insulation material 150 may be formed in a one-piece form with the first portion 152 and the second portion 154. In some embodiments, the third portion 156 may be formed in an individual piece independent from the first portion 152 and the second portion 154. In some embodiments, the third portion 156 may be formed of a material independent from the first portion 152 and the second portion 154.

The semiconductor device 170 may include one or more devices, which may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In some embodiments, the semiconductor device 170 includes integrated circuit devices, such as transistors, capacitors, inductors, resistors, metallization layers, external connectors, and the like, therein, as desired for a particular functionality. In some embodiments, the semiconductor device 170 may include more than one of the same type of device, or may include different devices. In some embodiments, the semiconductor device 170 may be a packaged semiconductor device.

In some embodiments, the semiconductor device 170 is placed on the package substrate 160 through a pick up and place process, but the disclosure is not limited thereto. In some embodiments, after the semiconductor device 170 is placed on the conductive connectors 120 on the package substrate 160, a reflow process may be adopted to bond the semiconductor device 170 to the conductive connectors 120 on the package substrate 160. Accordingly, the semiconductor device 170 may be electrically connected to the redistribution structure 110 of the package substrate 160 through the conductive connectors 120. In some embodiments, external connectors are formed on the semiconductor device 170 instead of or in addition to the conductive connectors 120 formed on the redistribution structure 110. In some embodiments, the conductive connectors 120 are omitted, and the semiconductor device 170 is bonded to the redistribution structure 110 of the package substrate 160 using a direct bonding technique such as thermocompression bonding, hybrid bonding, metal-to-metal bonding, or the like. However, any suitable bonding technique may be utilized.

In some embodiments, the underfill 180 may be deposited along the gap between the semiconductor device 170 and the redistribution structure 110. The underfill 180 may also at least partially surround some conductive connectors 120. The underfill 180 may be a material such as a molding compound, an epoxy, an underfill, a molding underfill (MUF), a resin, or the like. In some embodiments, the underfill 180 may extend to partially cover the sidewall E170 of the semiconductor device 170. In some embodiments, further semiconductor device may be bonded to the package substrate 110, and thus the semiconductor package 100 may include two or more semiconductor devices bonded to the package substrate 160. Accordingly, the structure of FIG. 6 including one semiconductor device 170 is an explementary example and is not intended to limited the disclosure.

The semiconductor package 100 includes the package substrate 160 forming by bonding the interconnect structure 140 to the redistribution structure 110 and the redistribution structure 110 has one or more reduced structure R110 filled with the insulation material 150. The insulation material 150 may extend into the redistribution structure 110 in a finger-like structure in the cross section to cover the wedged surface WE defining the reduced structure 110R. The finger-like structure of the insulation material 150 may be the second portion 154 in FIG. 6. The second portion 154 of the insulation material 150 may have a taper shape with non-fixed width W154. The second portion 154 is formed by filling the reduced structures 110R formed in the step of FIG. 2A and FIG. 2B and thus the second portion 154 may have a plane view shape extending along the cutting trace CT1. In the embodiment, the plane view shape of the second portion 154 may be an encircled ring-like pattern surrounding the package substrate 110, but the disclosure is not limited thereto.

Figure 7:
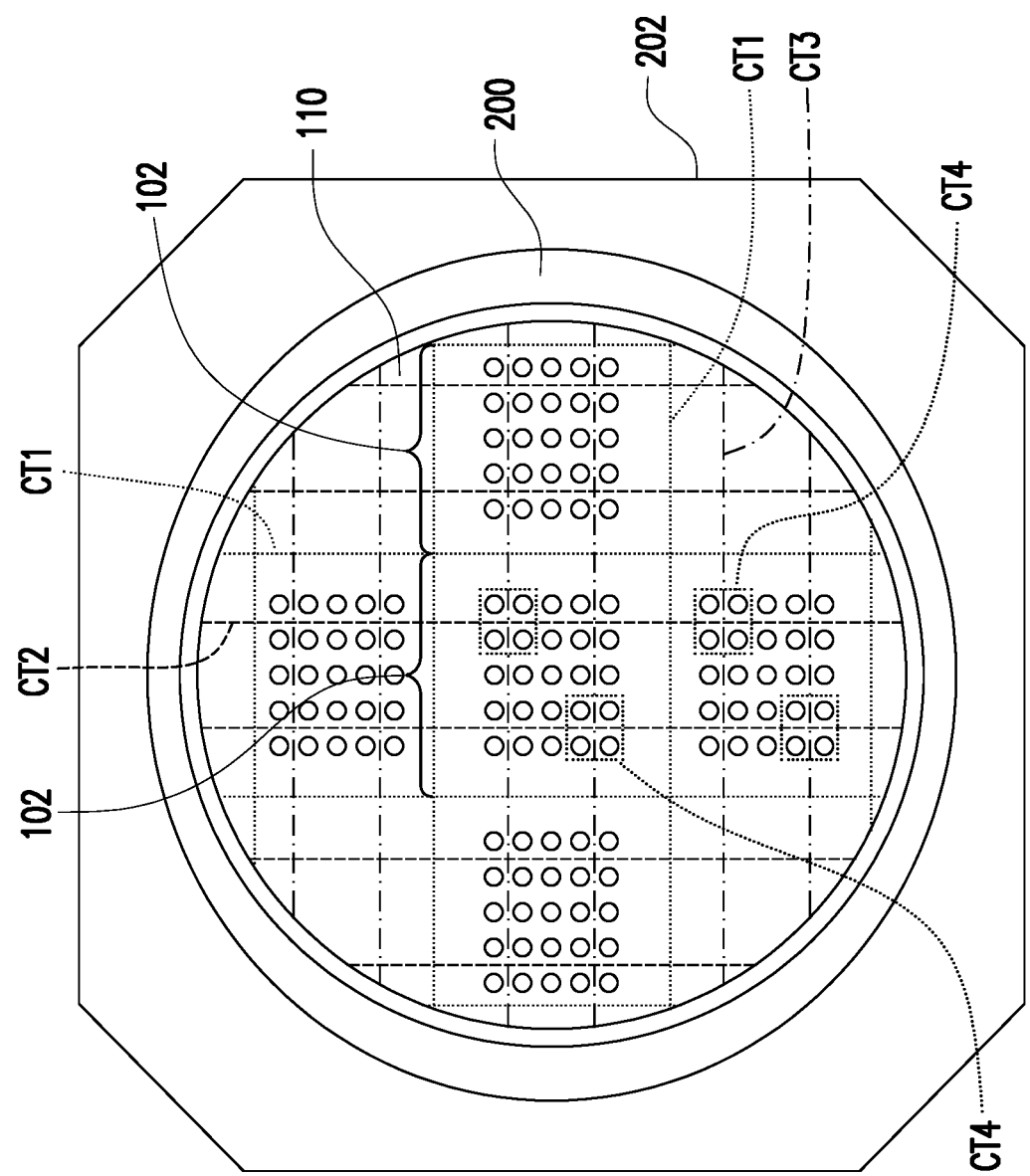
FIG. 7 schematically illustrate a plane view for cutting traces of a precut step of fabricating a semiconductor package in accordance with some embodiments of the disclosure.

FIG. 7 schematically illustrate a plane view for cutting traces of a precut step of fabricating a semiconductor package in accordance with some embodiments of the disclosure. The structure shown in FIG. 7 may provide non-limited alternative examples of the arrangement of the cutting traces of FIG. 2A and thus the same reference numbers in FIGS. 2A and 7 may refer the same elements. In FIG. 7, the redistribution structure 110 is carried by the carrier 200 supported by the frame 202. The redistribution structure 110 may include a plurality of package regions 102. In FIG. 7, a pre-cut process may be performed as the step indicated in FIG. 2A. The pre-cut process in the embodiment of FIG. 7 may be performed along the cutting traces CT1, cutting traces CT2, cutting traces CT3 and cutting traces CT4. In some embodiments, the cutting traces CT1 may be planned along the boundaries of adjacent package regions 102 as described in FIG. 2A. In some embodiments, the cutting traces CT2 may be planned to pass through one or more of the package regions 102 in one direction and the cutting traces CT2 may be planned to pass through one or more of the package regions 102 in another direction. In some embodiments, the pitches of the cutting traces CT2 or CT3 may be variable or identical. In some embodiments, one or more of the cutting traces CT2 or CT3 may pass through one package region 102. In some embodiments, the cutting traces CT4 may be planned to form an encircled ring-like trace with the package regions 102.

In some embodiments, the redistribution structure 110 may have blank zones (referring the blank zone 104 in FIG. 2B) and the cutting traces CT1, CT2, CT3 and CT4 are arranged within the blank zones. Therefore, the pre-cut process may not cut the redistribution layers (referring the redistribution layers 114 in FIG. 2B) in the redistribution structure 110. Though FIG. 7 shows that the cutting traces CT1, CT2, CT3 and CT4 are all arranged in one structure, but the disclosure is not limited thereto. In various embodiments, the cutting traces CT1, CT2, CT3 and CT4 may be respectively applied to different structures. For example, one or more embodiment may include the structure of the cutting traces CT1 arranged in the redistribution structure 110 without other cutting traces, one or more embodiment may include the structure of the cutting traces CT2 arranged in the redistribution structure 110 without other cutting traces, one or more embodiment may include the structure of the cutting traces CT3 arranged in the redistribution structure 110 without other cutting traces, and one or more embodiment may include the structure of the cutting traces CT4 arranged in the redistribution structure 110 without other cutting traces. In some embodiments, the redistribution structure 110 may be pre-cut along one or more selected from the cutting traces CT1, CT2, CT3 and CT4.

In some embodiments, the precut process performed along the cutting traces CT1, CT2, CT3 and CT4 would form corresponding reduced structures in the redistribution structure 110. In addition, as shown in the step of FIG. 5A and FIG. 5G, the insulation material 150 may be formed to fill the reduced structures. Therefore, in the fabricated package substrate 160, the second portion 154 filling the reduced structures may have a plane view pattern as shown in any of the cutting traces CT1, CT2, CT3 and CT4. For example, in some embodiments adopting the cutting trace CT4 in the precut process, the second portion 154 of the insulation material 150 may have a ring-like plane view within the redistribution structure 110 of the package substrate 160.

Figure 8:
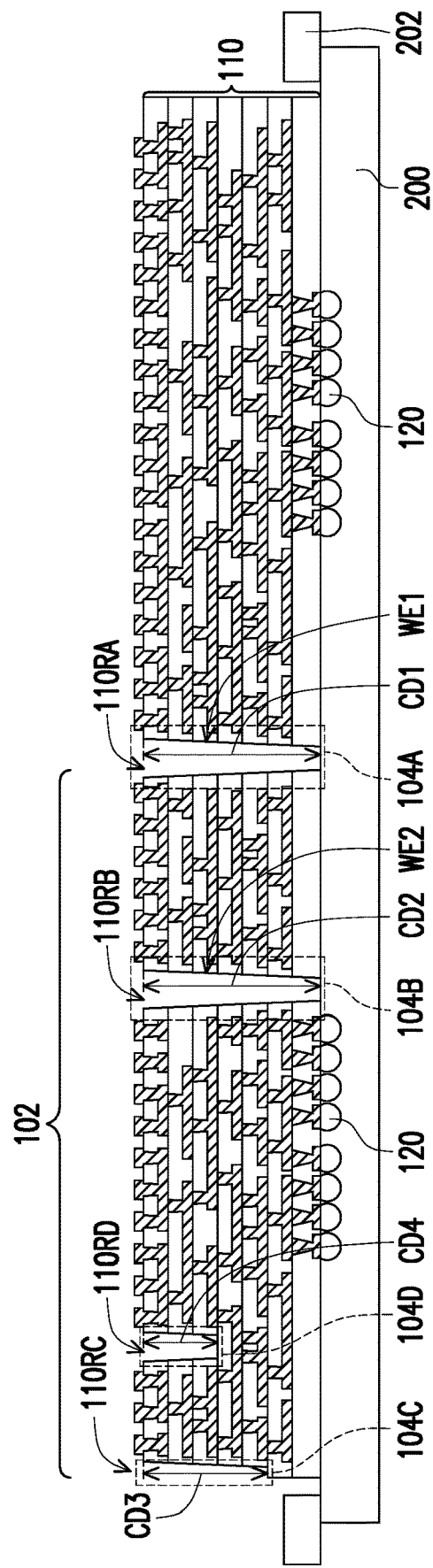
FIG. 8 schematically illustrate a cross sectional view for cutting depths of a precut step of fabricating a semiconductor package in accordance with some embodiments of the disclosure.

FIG. 8 schematically illustrate a cross sectional view for cutting depths of a precut step of fabricating a semiconductor package in accordance with some embodiments of the disclosure. The structure shown in FIG. 8 may provide non-limited alternative examples of the cut depth of FIG. 2B and thus the same reference numbers in FIGS. 2B and 7 may refer the same elements. In FIG. 8, the structure of the redistribution structure 110 subjected to the pre-cut process described in FIG. 2A and FIG. 2B is shown. The redistribution structure 110 may include one or more blank zones selected from blank zones 104A to 104C where the redistribution layers 114 are absent and the insulation layers 112 are immediately stacked on one another without being interposed. The blank zones 104A to 104D may reach different levels of the redistribution structure 110. For example, in FIG. 8, the blank zones 104C and 104D may not extend through the thickness of the redistribution structure 110 while the blank zones 104A and 104B extend through the thickness of the redistribution structure 110. One or more of the blank zones 104A to 104D may be applied in one embodiment of the redistribution structure 110. In other words, the redistribution structure 110 may include one of the blank zones 104A to 104D without other blank zones 104A to 104D, two of one of the blank zones 104A to 104D without the other blank zones 104A to 104D, or the like. In some embodiments, the blank zones 104A to 104D may be applied in different embodiments of the redistribution structure 110.

In some embodiments, the pre-cut process is performed along the blank zone 104A until a cutting depth CD1 reaches to form a reduced structure 110RA. The cutting depth CD1 may be substantially the same as the thickness of the redistribution structure 110 and thus, the reduced structure 110RA may extend through all insulation layers 112 of the redistribution structure 110. Accordingly, the wedged surface WE1 defining and demarcating the reduced structure 110RA may extend through the thickness of the redistribution structure 110. The wedged surface WE1 may be gradually shrunk in the direction away from the conductive connectors 120.

In some embodiments, the pre-cut process is performed along the blank zone 104B until a cutting depth CD2 reaches to form a reduced structure 110RB. The cutting depth CD2 may be substantially the same as the thickness of the redistribution structure 110 and thus, the reduced structure 110RB may extend through all insulation layers 112 of the redistribution structure 110. Accordingly, the wedged surface WE2 defining the reduced structure 110RB may extend through the thickness of the redistribution structure 110. The wedged surface WE2 may be gradually shrunk in the direction away from the conductive connectors 120. In some embodiments, the wedged surface WE1 may be positioned at a boundary of the package region 102 and the wedged surface WE2 may be positioned within the package region 102.

In some embodiments, the pre-cut process is performed along the blank zone 104C until a cutting depth CD3 reaches to form a reduced structure 110RC. The cutting depth CD3 may be smaller than the thickness of the redistribution structure 110 and thus, the reduced structure 110RC may reach one of the insulation layers 112 in the redistribution structure 110. In some embodiments, the wedged surface WE3 defining the reduced structure 110RC may stop at the one of the insulation layers 112 in the redistribution structure 110. The wedged surface WE3 may be gradually shrunk in the direction away from the conductive connectors 120.

In some embodiments, the pre-cut process is performed along the blank zone 104D until a cutting depth CD4 reaches to form a reduced structure 110RD. The cutting depth CD4 may be smaller than the thickness of the redistribution structure 110 and thus, the reduced structure 110RD may reach one of the insulation layers 112 in the redistribution structure 110. In some embodiments, the wedged surface WE4 defining the reduced structure 110RD may stop at the one of the insulation layers 112 in the redistribution structure 110. The wedged surface WE4 may be gradually shrunk in the direction away from the conductive connectors 120. In some embodiments, the wedged surface WE3 may be positioned at a boundary of the package region 102 and the wedged surface WE4 may be positioned within the package region 102.

Figure 9:
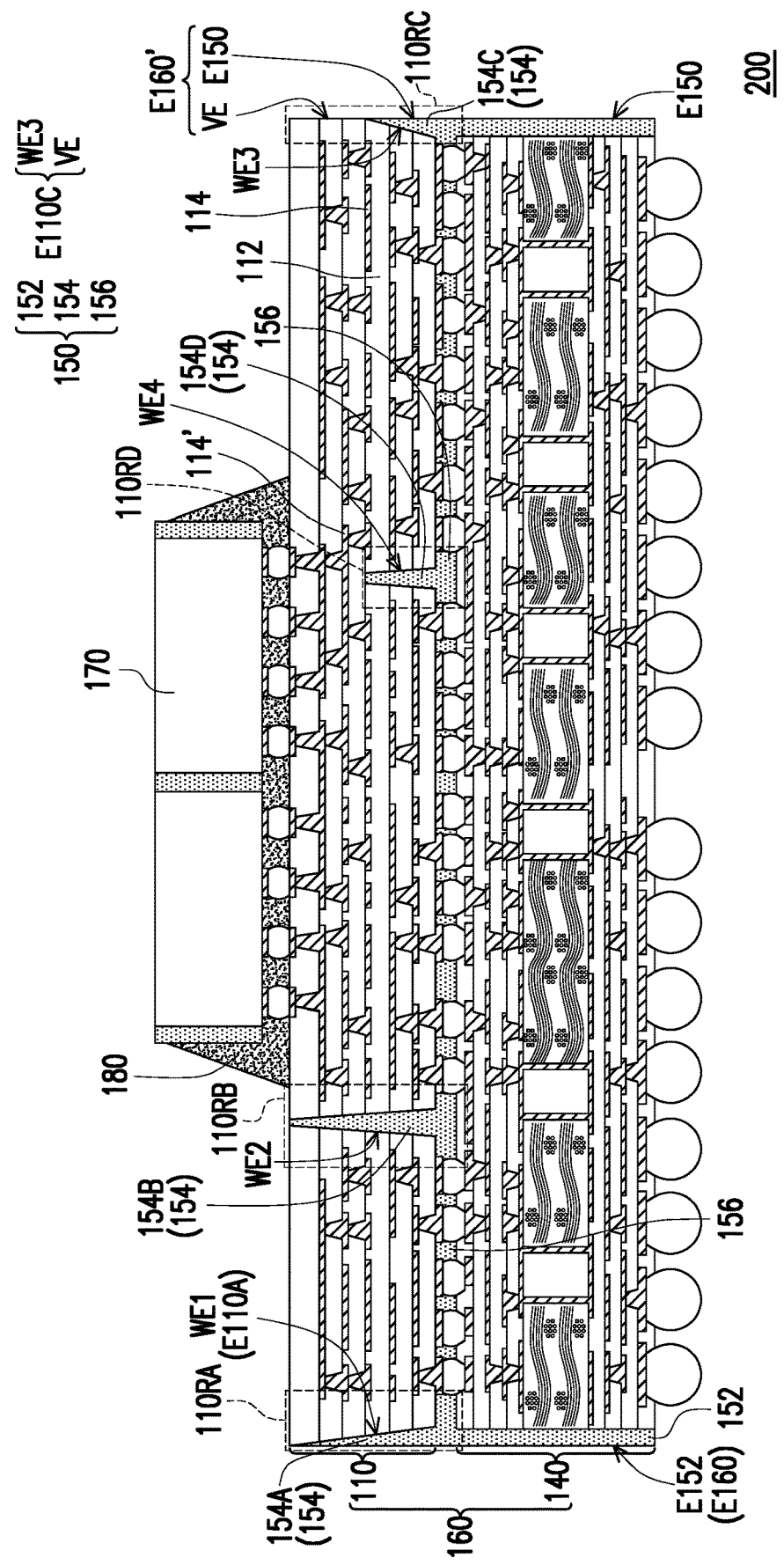
FIG. 9 schematically illustrates a semiconductor package in accordance with some embodiments of the disclosure.

FIG. 9 schematically illustrates a semiconductor package in accordance with some embodiments of the disclosure. In FIG. 9 the semiconductor package 200 may be fabricated from the structure shown in FIG. 8 using the steps described in FIGS. 2A to 5A, FIGS. 2B to 5B and FIG. 6. The semiconductor package 200 may include the components similar to the semiconductor package 100 described in FIG. 6 and thus the components indicating by the same reference numbers in the two embodiments are applicable to and incorporated to each other. The semiconductor device 200 may include a package substrate 160 including a redistribution structure 110 connected to an interconnect structure 140 and an insulation material 150 laterally encapsulating at least the interconnect structure 140, a semiconductor device 170 bonded to the package substrate 160 and an underfill 180 fill the gap between the semiconductor device 170 and the package substrate 160. The semiconductor device 170, the interconnect structure 140 and the underfill 180 may refer to those described in the previous embodiments. In FIG. 9, the redistribution structure 110 may have various reduced structures such as the reduced structures 110RA, 110RB, 110RC and 110RD. The reduced structures 110RA, 110RB, 110RC and 110RD may be formed by the precut step of forming the structure of FIG. 8. The reduced structures 110RA, 110RB, 110RC and 110RD may be formed by various cutting depths and cutting traces of the precut process as described in FIG. 2A and FIG. 2B. The insulation material 150 may include the first portion 152 laterally surrounding the interconnect structure 140, the second portions 154 filling the reduced structures 110RA, 110RB, 110RC and 110RD and the third portion 156 filling the spaces between the redistribution structure 110 and the interconnect structure 140. In the embodiment, the second portions 154 filling the reduced structures 110RA, 110RB, 110RC and 110RD are respective indicated by the reference numbers 154A, 154B, 154C and 154D.

Figure 10A:
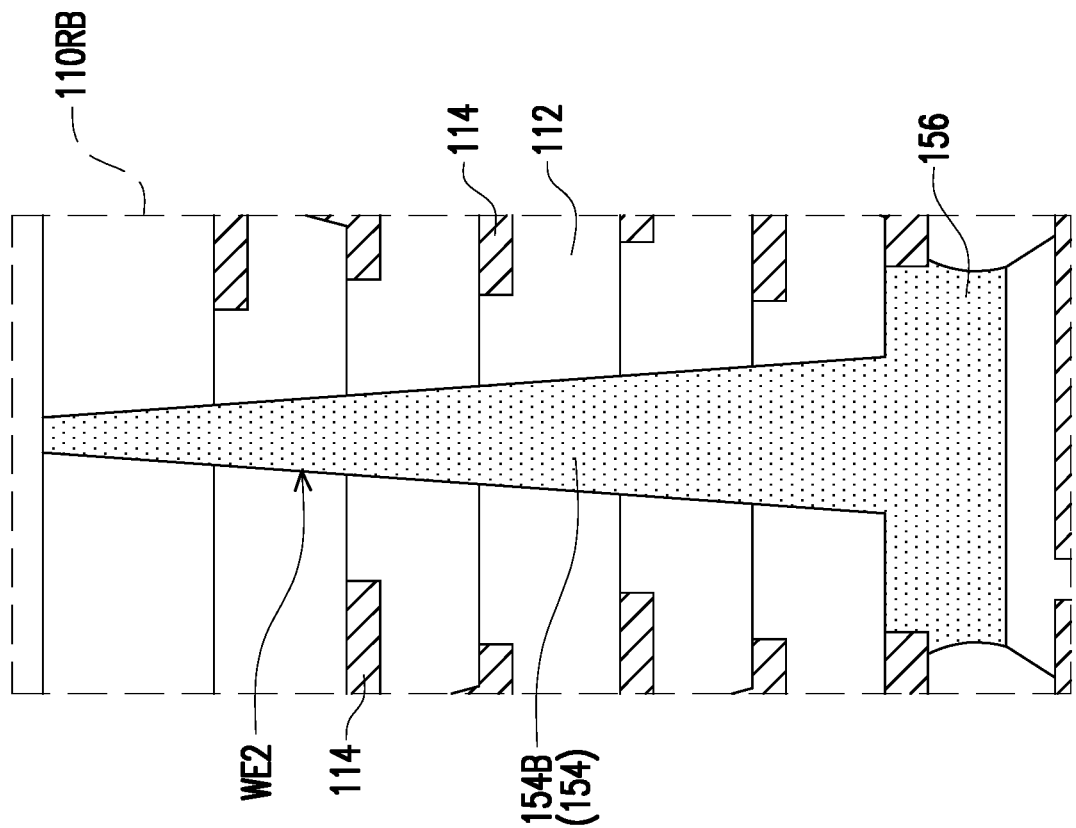
FIGS. 10A to 10D schematically illustrate respective enlarged portions of a semiconductor package in accordance with some embodiments of the disclosure.

FIGS. 10A to 10D schematically illustrate respective enlarged portions of a semiconductor package in accordance with some embodiments of the disclosure. Referring to FIG. 9 and FIG. 10A, the reduced structure 110RA extends through the thickness of the redistribution structure 110 and through all the insulating layers 114 of the redistribution structure 110. The reduced structure 110RA is positioned at edge to serve as the sidewall E110A of the redistribution structure 110. The second portion 154A fills the reduced structure 110RA and extends along the wedged surface WE1 defining the reduced structure 110RA. The second portion 154A may have a lateral dimension gradually reduced in a direction away from the interconnect structure 140 to have a taper pattern, but the disclosure is not limited thereto. The sidewall E150 of the insulation material 150 may extend linearly along the thickness direction of the package substrate 160 to compensate the oblique configuration of the wedged surface WE1 to form the package substrate 160 with an upright structure. For example, the sidewall E110A as well as the wedged surface WE1 is oblique to the sidewall E150 which is known as the sidewall E160.

Figure 10B:
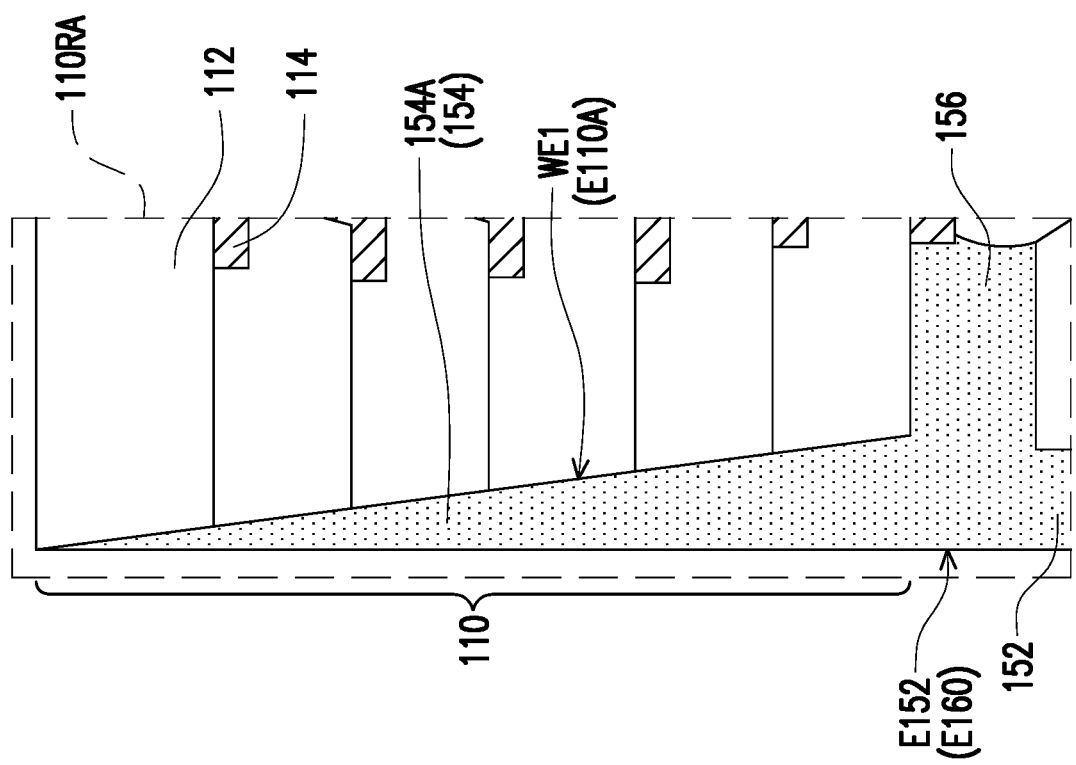

Referring to FIG. 9 and FIG. 10B, the reduced structure 110RB extends through the thickness of the redistribution structure 110. The reduced structure 110RB is positioned between different portions of the redistribution layers 114 in the redistribution structure 110. The second portion 154B fills the reduced structure 110RB and extends along the wedged surface WE2 defining the reduced structure 110RB. The second portion 154B may extend through all of the insulating layers 112 and the redistribution layers 114 are spaced from the second portion 154B of the insulation material 150. The second portion 154B may have a lateral dimension gradually reduced in a direction away from the interconnect structure 140 to have a taper shape between the redistribution layers 114 in the redistribution structure 110. The second portion 154B may form a finger-like structure extending in the redistribution structure 110 and between different portions of the redistribution layers 114. The second portion 154B is connected to the third portion 156 surrounding the conductive connectors 120 to have a push-pin-like shape in a cross section, but the disclosure is not limited thereto.

Figure 10D:
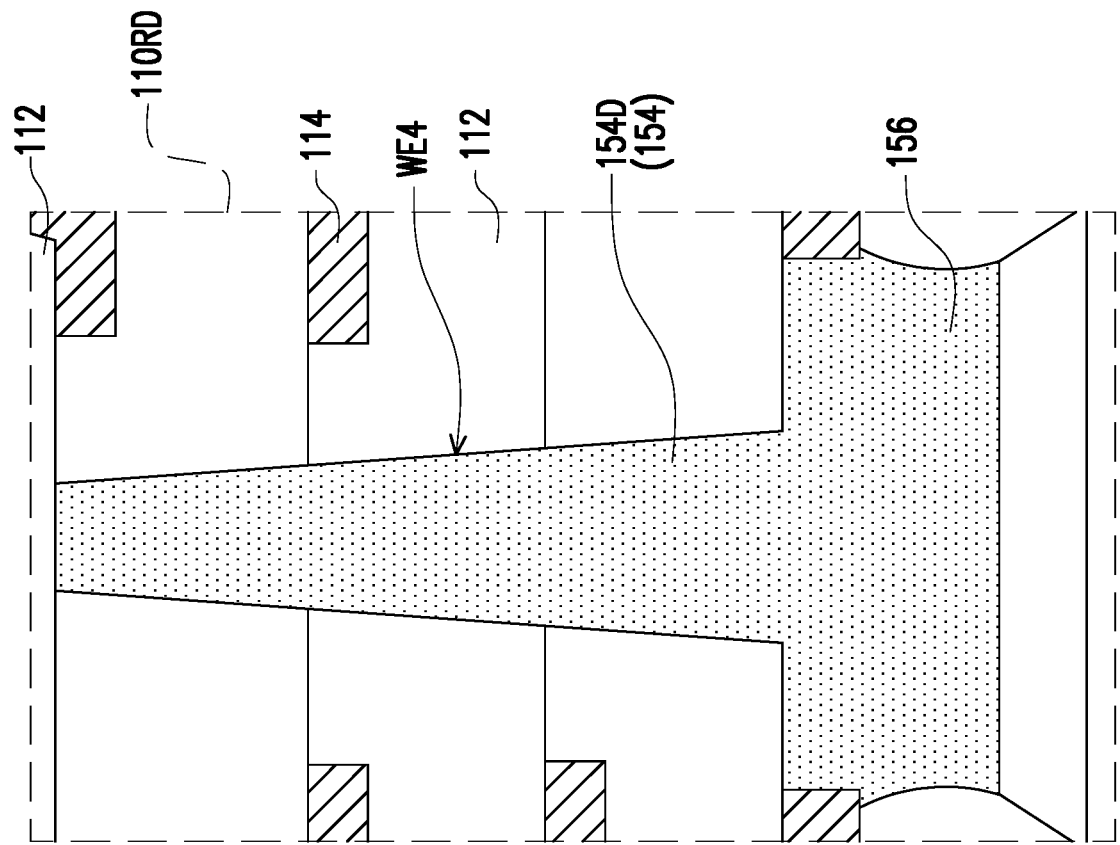
Figure 10C:
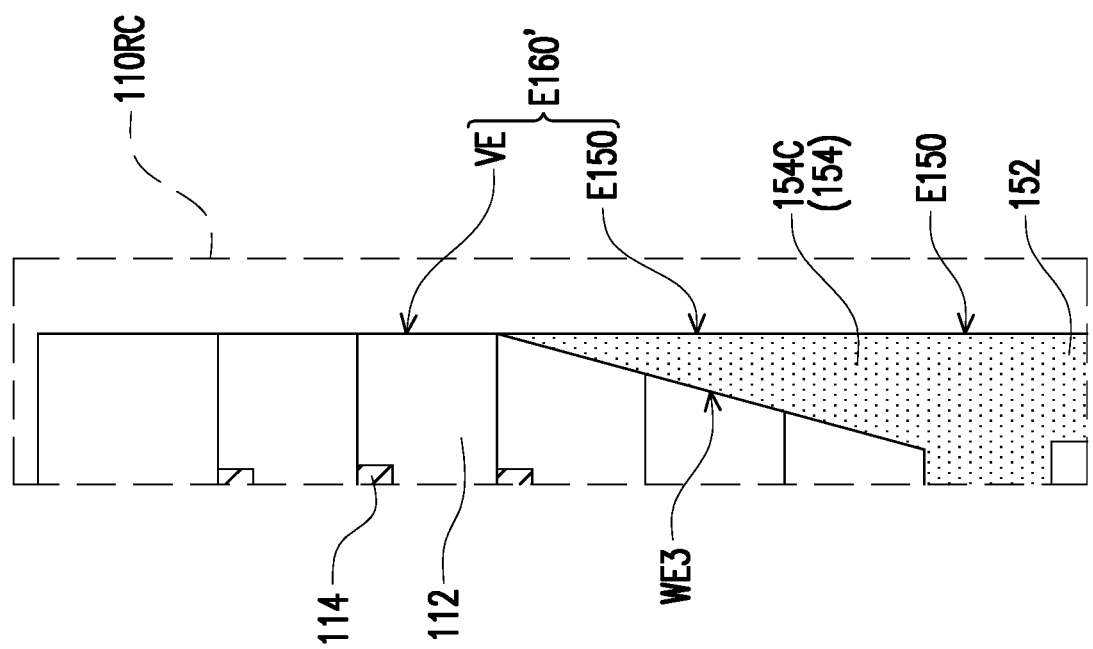

Referring to FIG. 9 and FIG. 10C, the reduced structure 110RC does not extend through the thickness of the redistribution structure 110 and stops at one of the insulation layers 112 in the redistribution structure 110. The second portion 154C fills the reduced structure 110RC and extends along the wedged surface WE3 defining the reduced structure 110RC. The second portion 154C may have a lateral dimension gradually reduced in a direction away from the interconnect structure 140 to have a taper pattern. The reduced structure 110RC is positioned at edge and thus the sidewall E110C of the redistribution structure 110 includes the wedged surface WE3 and a vertical surface VE. The wedged surface WE3 is oblique and shrunk with respect to the vertical surface VE. The wedged surface WE3 is formed by the pre-cut process described in FIGS. 2A, 2B and 8 while the vertical surface VE is formed by the singulation process described in FIGS. 5A and 5B. The vertical surface VE may be substantially vertical and may be not. The vertical surface VE may be coplanar with the sidewall E150 of the insulation material 150 to form the sidewall E160' of the package substrate 160. The vertical surface VE is not covered by the insulation material 150. The second portion 154C may compensate the reduced structure 110RC and thus the sidewall E160' of the package substrate 160 may have an upright configuration.

Referring to FIG. 9 and FIG. 10D, the reduced structure 110RD does not extend through the thickness of the redistribution structure 110 and stop at one of the insulation layers 112 of the redistribution structure 110. Specifically, the reduced structure 110RD extends through one or more of the insulating layers 112 and one or more other of the insulating layers 112 are not broken by the reduced structure 110RD. For example, in FIG. 9, the redistribution structure 110 includes six insulating layers 112 and the reduced structure 110RD extends through three of the insulating layers 112 adjacent to the interconnect structure 140 while the reduced structure 110RD stops at the fourth insulating layer 112 calculated from the side adjacent to the interconnect structure 140, but the disclosure is not limited thereto. Accordingly, the second portion 154D filling the reduced structure 110RD may extend through and be in contact with the same numbers of the insulating layers 112, and the redistribution layers 114 are spaced from the second portion 154D. The reduced structure 110RD is positioned between different portions of the redistribution layers 114 in the redistribution structure 110. The second portion 154D extends along the wedged surface WE4 defining the reduced structure 110RD. The second portion 154D may have a lateral dimension gradually reduced in a direction away from the interconnect structure 140 to have a taper pattern inserted in the redistribution structure 110. The second portion 154D may form a finger-like structure in the redistribution structure 110 in the cross section. In some embodiments, a portion of the redistribution layers 114 in the redistribution structure 110, such as the redistribution layer 114' may be positioned at a level outside the extending depth of the reduced structure 110RD and may laterally extend through opposite sides of the reduced structure 110RD. Therefore, the redistribution layer 114' may overlap with the second portion 154D of the insulation material 150 in the thickness direction. In some embodiments, one or more insulating layers 112 continuously extends between the second portion 154D filling the reduced structure 110RD and the redistribution layer 114' so that the redistribution layer 114' is not in contact with the second portion 154D.

In some embodiments, the second portion 154A filling the reduced structure 110RA may be individually applied in one embodiment of a semiconductor package, such as the semiconductor device 100. Similarly, the second portion 154B filling the reduced structure 110RB, the second portion 154C filling the reduced structure 110RC and the second portion 154D filling the reduced structure 110RD may be independently applied in various embodiments of a semiconductor package. In some embodiments of the semiconductor package, one or more of the second portion 154A filling the reduced structure 110RA, the second portion 154B filling the reduced structure 110RB, the second portion 154C filling the reduced structure 110RC and the second portion 154D filling the reduced structure 110RD may be presented in the same semiconductor package. Therefore, the semiconductor package 200 is an exemplary example showing various alternatives of the second portion 154 without limiting to include all the alternatives in one package.

In some embodiments of the disclosure, the method of fabricating a semiconductor package may include a pre-cut process on a redistribution structure in a substantially wafer form to form a reduced structure defining by wedged surface. The interconnect structures are bonded to the redistribution structure at the respective package regions and the stress due to the bonding of the interconnect structures may be releases, spread and/or mitigated through the reduced structure. Accordingly, the warpage of the carrier carrying the redistribution structure in the wafer form may be mitigated and, which improves the connections between different interconnect structures and the redistribution structure and enhances the yield rate of the method of fabricating the semiconductor package. The semiconductor package may include the package substrate having the insulation material filling the reduced structure so that the package substrate has a substantially upright structure and desirable mechanical property. In some embodiments, the reduced structure filled with the insulation material would not cause unwanted voids which facilitates to ensure the mechanical property of the package device.

In light of the above, the semiconductor package may include one or more reduced structure in the redistribution structure and the insulation material encapsulating the interconnect structure may fill the reduced structure to obtain a package substrate with a substantially upright shape. The reduced structure is formed by a pre-cut process performing on the redistribution structure and facilitates the improvement of the connection between the interconnect structure and the redistribution structure. Therefore, the quality of the semiconductor package may be ensured.

In accordance with an embodiment, a semiconductor package includes a package substrate and a semiconductor device. The package substrate includes a redistribution structure, an interconnect structure bonded to the interconnect structure and an insulation material laterally surrounding the interconnect structure, wherein the redistribution structure has a reduced structure and the insulation material fills the reduced structure. The semiconductor device is bonded to the package substrate. The redistribution structure includes a wedged surface defining the reduced structure. The insulation material includes a first portion laterally surrounding the interconnect structure and a second portion filling the reduced structure. The second portion has a lateral dimension gradually reduced in a direction away from the interconnect structure. The insulation material further fills a gap between the interconnect structure and the redistribution structure. The redistribution structure includes insulating layers and redistribution layers alternately disposed in a thickness direction and the reduced structure extends through one or more of the insulating layers. The redistribution structure has a blank zone absent of the redistribution layers and the reduced structure is located in the blank zone. The insulation material covers a sidewall of the redistribution structure.

In accordance with another embodiment, a semiconductor package includes a package substrate and a semiconductor device. The package substrate includes a redistribution structure, an interconnect structure bonded to the interconnect structure and an insulation material laterally surrounding the interconnect structure, wherein the redistribution structure comprises insulating layers and redistribution layers between the insulating layers, and the insulation material include a portion extend through one or more of the insulating layers, and the redistribution layers are spaced from the portion of the insulation material. The semiconductor device is bonded to the package substrate. The portion of the insulation material has a taper shape. The portion of the insulation material extend through all of the insulating layers of the redistribution structure. A sidewall of the redistribution structure includes a wedged surface and a vertical surface, and the wedged surface is oblique with respect to the vertical surface. A sidewall of the insulation material is coplanar with the vertical surface. External connectors are disposed on an external bonding surface of the interconnect structure and the insulation material exposes the external bonding surface.

In accordance with yet another embodiment, a method of fabricating a semiconductor package includes transferring a redistribution structure including insulating layers and redistribution layers between the insulating layers on a carrier; performing a pre-cut process to form a reduced structure in the redistribution structure; bonding interconnect structures to the redistribution structure at a plurality of package regions; forming an insulation material filling the reduced structure; and bonding a semiconductor device to the redistribution structure. The precut process is performed until a cutting depth extending one or more of the insulating layers. The precut process is performed along a cutting trace within a blank zone of the redistribution structure and the blank zone is absent of the redistribution layers. The cutting trace extends along a boundary between the package regions. The insulation material laterally surrounds the interconnect structure. A singulation process is further performed to separate the package regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a package substrate comprising a redistribution structure, an interconnect structure bonded to the redistribution structure and an insulation material laterally surrounding the interconnect structure, wherein the redistribution structure has a reduced structure and the insulation material fills the reduced structure and further fills a gap between the interconnect structure and the redistribution structure; and
a semiconductor device bonded to the package substrate.

2. The semiconductor package of claim 1, wherein the redistribution structure has a wedged surface defining the reduced structure.

3. The semiconductor package of claim 1, wherein the insulation material includes a first portion laterally surrounding the interconnect structure and a second portion filling the reduced structure.

4. The semiconductor package of claim 3, wherein the second portion has a lateral dimension gradually reduced in a direction away from the interconnect structure.

5. The semiconductor package of claim 1, wherein the redistribution structure includes insulating layers and redistribution layers alternately disposed in a thickness direction and the reduced structure extends through one or more of the insulating layers.

6. The semiconductor package of claim 5, wherein the redistribution structure has a blank zone absent of the redistribution layers and the reduced structure is located in the blank zone.

7. The semiconductor package of claim 1, wherein the insulation material covers a sidewall of the redistribution structure.

8. A semiconductor package, comprising:
a package substrate comprising a redistribution structure, an interconnect structure bonded to the redistribution structure and an insulation material laterally surrounding the interconnect structure and further filling a gap between the interconnect structure and the redistribution structure, wherein the redistribution structure comprises insulating layers and redistribution layers between the insulating layers, and the insulation material include a portion extending through one or more of the insulating layers and the redistribution layers are spaced from the portion of the insulation material; and
a semiconductor device bonded to the package substrate.

9. The semiconductor package of claim 8, wherein the portion of the insulation material has a taper shape.

10. The semiconductor package of claim 8, wherein the portion of the insulation material extend through all of the insulating layers of the redistribution structure.

11. The semiconductor package of claim 8, wherein a sidewall of the redistribution structure includes a wedged surface and a vertical surface, and the wedged surface is oblique with respect to the vertical surface.

12. The package of claim 11, wherein a sidewall of the insulation material is coplanar with the vertical surface.

13. The semiconductor package of claim 8, further comprising external connectors disposed on an external bonding surface of the interconnect structure and the insulation material exposes the external bonding surface.

14. A semiconductor package comprising:
a package substrate comprising a redistribution structure, an interconnect structure, conductive connectors connecting between the redistribution structure and the interconnect structure, and an insulation material laterally surrounding the conductive connectors and the interconnect structure, wherein the insulation material comprises a taper protrusion extending toward the redistribution structure and further fills a gap between the interconnect structure and the redistribution structure; and
a semiconductor device bonded to the redistribution structure.

15. The semiconductor package of claim 14, wherein the taper protrusion surrounds an outer edge of the redistribution structure.

16. The semiconductor package of claim 14, wherein the taper protrusion is surrounded by the redistribution structure.

17. The semiconductor package of claim 14, wherein the taper protrusion has a protrusion height less than a thickness of the redistribution structure.

18. The semiconductor package of claim 14, wherein the taper protrusion has a lateral dimension gradually reduced in a direction away from the interconnect structure.

19. The semiconductor package of claim 14, wherein the redistribution structure has a shape complementary to the taper protrusion.

20. The semiconductor package of claim 14, wherein the conductive connectors are located in the gap between the interconnect structure and the redistribution structure.

* * * * *